(12) United States Patent
Wang et al.

(10) Patent No.: US 11,404,099 B1
(45) Date of Patent: Aug. 2, 2022

(54) USING SPLIT WORD LINES AND SWITCHES FOR REDUCING CAPACITIVE LOADING ON A MEMORY SYSTEM

(71) Applicant: Taiwan Semiconductor Manufacturing Company Ltd., Hsinchu (TW)

(72) Inventors: Sheng-Chen Wang, Hsinchu (TW); Meng-Han Lin, Hsinchu (TW); Chia-En Huang, Xinfeng Township (TW); Yi-Ching Liu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 17/241,263

(22) Filed: Apr. 27, 2021

(51) Int. Cl.
*G11C 11/22* (2006.01)
*H01L 27/11597* (2017.01)
*H01L 27/1159* (2017.01)
*H01L 23/528* (2006.01)

(52) U.S. Cl.
CPC ........ *G11C 11/2259* (2013.01); *G11C 11/223* (2013.01); *H01L 23/528* (2013.01); *H01L 27/1159* (2013.01); *H01L 27/11597* (2013.01)

(58) Field of Classification Search
CPC . G11C 11/2259; G11C 11/223; H01L 23/528; H01L 27/1159; H01L 27/11597
USPC .......................................................... 365/145
See application file for complete search history.

(56) References Cited

U.S. PATENT DOCUMENTS

2017/0154844 A1\* 6/2017 Kim ...................... H01L 27/228
2019/0319044 A1\* 10/2019 Harari ................. H01L 27/1157

\* cited by examiner

*Primary Examiner* — Fernando Hidalgo
(74) *Attorney, Agent, or Firm* — Foley & Lardner LLP

(57) ABSTRACT

Systems and methods disclosed herein are related to a memory system. In one aspect, the memory system includes a first set of memory cells including a first string of memory cells and a second string of memory cells; and a first switch including: a first electrode connected to first electrodes of the first string of memory cells and first electrodes of the second string of memory cells, and a second electrode connected to a first global bit line, wherein gate electrodes of the first string of memory cells are connected to a first word line and gate electrodes of the second string of memory cells are connected to a second word line.

20 Claims, 19 Drawing Sheets

| Application | HP | LP | HV |
|---|---|---|---|
| Product | HPC, AI computing device | Smart phone chips | Power supplier, voltage transition device |
| Embodiment 1 | SG > bit cell (SG WL Z-dir is 1.5X~3X to bit cell) | SG < bit cell (SG WL Z-dir is 0.5X~0.2X to bit cell) | |
| Embodiment 2 | SG device with thinner gate oxide | | SG device with thicker gate oxide |
| Embodiment 3 | SG device can adopt LK as isolation OX | | |

FIG. 8H

USING SPLIT WORD LINES AND SWITCHES FOR REDUCING CAPACITIVE LOADING ON A MEMORY SYSTEM

TECHNICAL FIELD

The disclosure relates generally to high density memory devices, and more particularly, to memory devices in which multiple planes of memory cells are arranged to provide a three-dimensional (3D) array including split word lines (WL) and/or switches to reduce bit line (BL) capacitance.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

SUMMARY

The example embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, example systems, methods, devices and computer program products are disclosed herein. It is understood, however, that these embodiments are presented by way of example and are not limiting, and it will be apparent to those of ordinary skill in the art who read the present disclosure that various modifications to the disclosed embodiments can be made while remaining within the scope of this disclosure.

BRIEF DESCRIPTION OF THE DRAWINGS

Various example embodiments of the present solution are described in detail below with reference to the following figures or drawings. The drawings are provided for purposes of illustration only and merely depict example embodiments of the present solution to facilitate the reader's understanding of the present solution. Therefore, the drawings should not be considered limiting of the breadth, scope, or applicability of the present solution. It should be noted that for clarity and ease of illustration, these drawings are not necessarily drawn to scale.

FIG. 8H is a table showing example embodiments of an HP application, an LP application, and an HV application.

DETAILED DESCRIPTION

Figure 1:
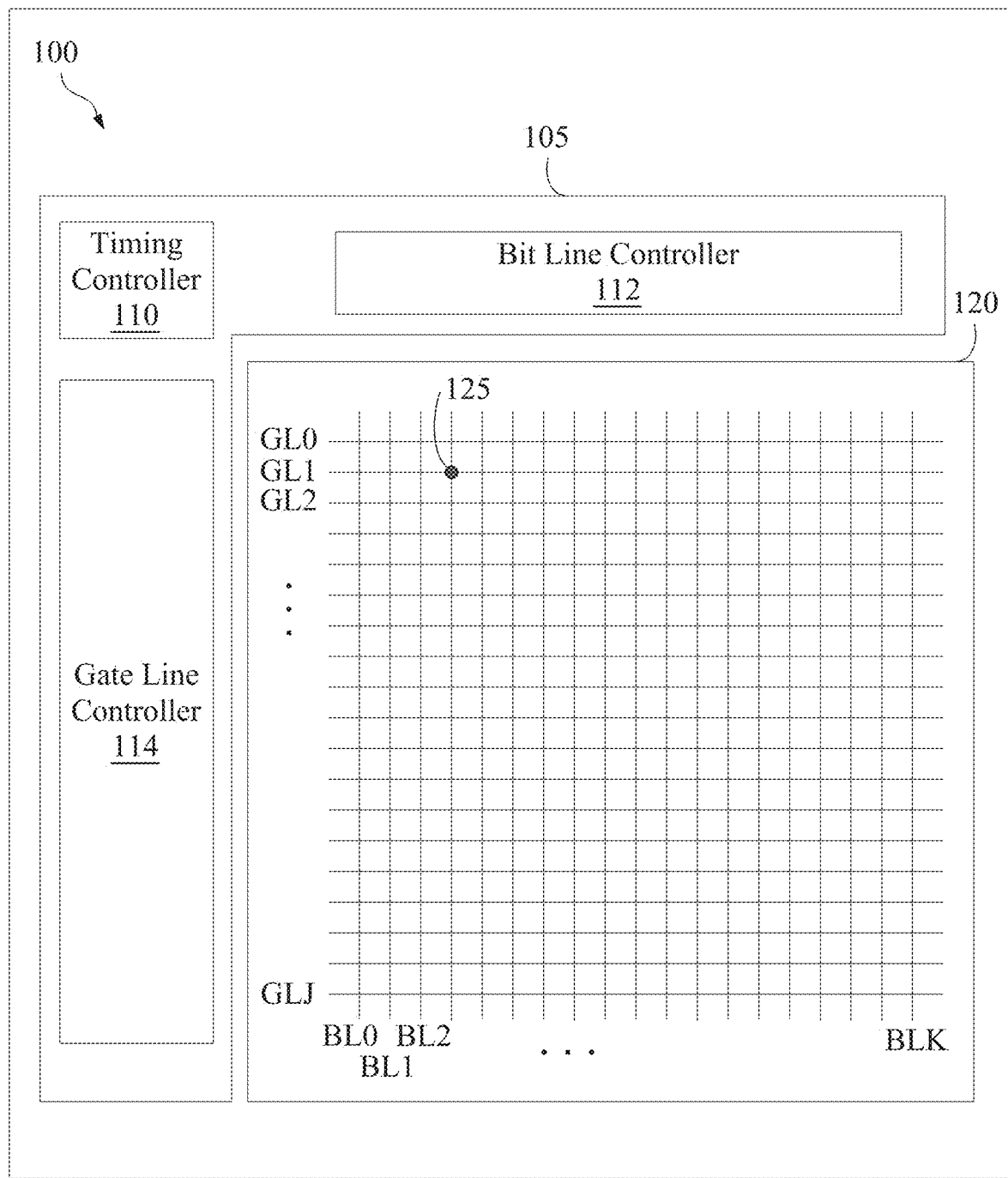
FIG. 1 is a diagram of a memory system, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes one or more switches (sometimes referred to as, "select gates") to couple or decouple local lines to a global line. A local line may be a metal rail, to which two or more memory cells are connected. For example, a local line may be a local select line (e.g., LSL[00] or LSL[10] in FIG. 3A), to which first electrodes (e.g., drain (or source) electrodes) of memory cells are connected. For example, a local line may be a local bit line (e.g., LBL[00] or LBL[10] in FIG. 3A), to which second electrodes (e.g., source (or drain) electrodes) of the memory cells are connected. A global line may be a metal rail, to which one or more of selected local lines can be electrically coupled through switches. For example, a global line may be a global select line (e.g., GSL[0] in FIG. 3A), to which two or more local select lines can be electrically coupled through switches. For example, a global line may be a global bit line (e.g., GBL[0] in FIG. 3A), to which two or more local bit lines can be electrically coupled through switches.

Advantageously, the memory system employing the disclosed switches can achieve several benefits. In one aspect, switches between a global line and local lines can be individually configured or operated to electrically couple or decouple respective local lines to the global line. By coupling a selected local line to a global line, a subset of a set of memory cells connected to the selected local line can be electrically coupled to the global line while the other subset of the set of memory cells connected to unselected local lines can be electrically decoupled from the global line. Hence, the global line may have a capacitive loading corresponding to the selected subset of the set of memory cells instead of a capacitive loading corresponding to the entire set of memory cells. Accordingly, the set of memory cells having many memory cells can be configured or operated through a global line with a low capacitive loading corresponding to the subset of the set of memory cells.

In another aspect, each word line in a memory array may be split into two word lines (e.g., a first word line and a second word line) to further reduce the capacitive loading on a controller during read and/or write operations. By splitting a word line, half of the memory cells in a subset of memory cells (e.g., subset 310 in FIG. 3A) are coupled to the first word line, while the other half is coupled to second word line.

By reducing the capacitive loading, operating speed of the memory system can be improved, which in turn, reduces the power consumption of the memory system. Moreover, the techniques and/or features of the present disclosure may also improve routing and shielding.

1. Memory Architecture

FIG. 1 is a diagram of a memory system 100, in accordance with an embodiment of the present disclosure. In some embodiments, the memory system 100 is implemented as an integrated circuit. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line and control lines. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a non-volatile memory cell. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more sense lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and sense lines of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 applies a voltage or a current to the memory cell 125 through a gate line GL connected to the memory cell 125, and the bit line controller 112 senses a voltage or current corresponding to data stored by the memory cell 125 through a sense line or a bit line connected to the memory cell 125. In some embodiments, the memory controller 105 includes more, fewer, or different components than shown in FIG. 1.

Figure 2:
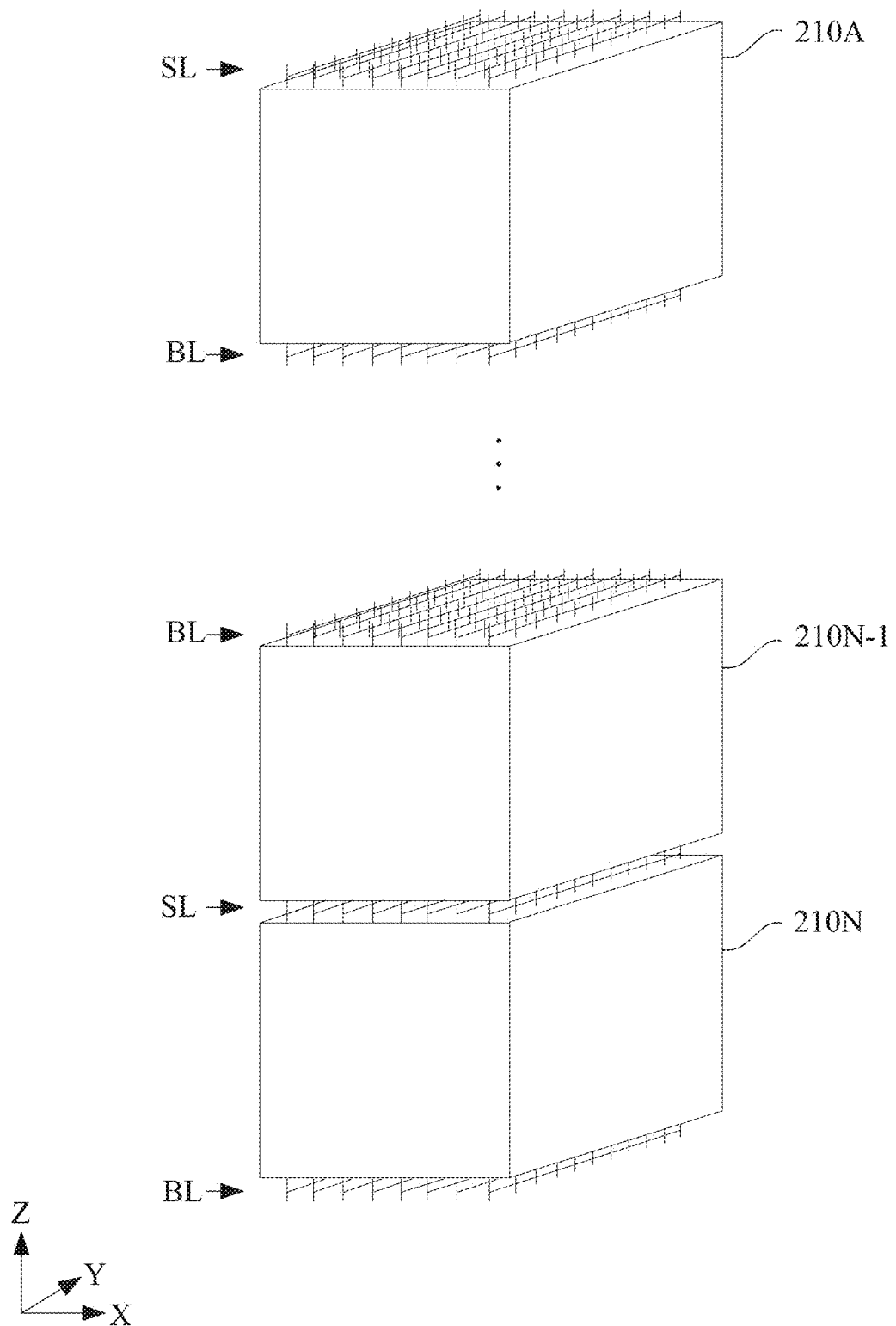
FIG. 2 is a diagram showing three-dimensional memory arrays, in accordance with an embodiment of the present disclosure.

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of memory cells 125 arranged in a three-dimensional array. In some embodiments, each memory array 210 may include a same number of memory cells 125. In some embodiments, two or more memory arrays 210 may include different numbers of memory cells 125. In one configuration, the memory arrays 210A . . . 210N are stacked along a Z-direction. Each memory array 210 may have bit lines BL on one side of the memory array 210 and have select lines SL on an opposite side of the memory array 210. In some embodiments, two adjacent memory arrays 210 may share select lines SL. In some embodiments, two adjacent memory arrays 210 may share bit lines BL. For example, memory arrays 210N-1, 210N share or are electrically coupled to a set of select lines SL. For example, memory arrays 210N-2, 210N-1 share or are electrically coupled to a set of bit line BL. By sharing select lines SL and/or bit lines BL, a number of drivers of the memory controller 105 to apply signals through the select lines SL and/or bit lines BL can be reduced to achieve area efficiency. In some embodiments, the memory array 120 includes additional memory arrays that may have separate select lines SL and/or bit lines BL than shown in FIG. 2.

2. Memory System(s) with Switches and/or Split Word Lines

Figure 3A:
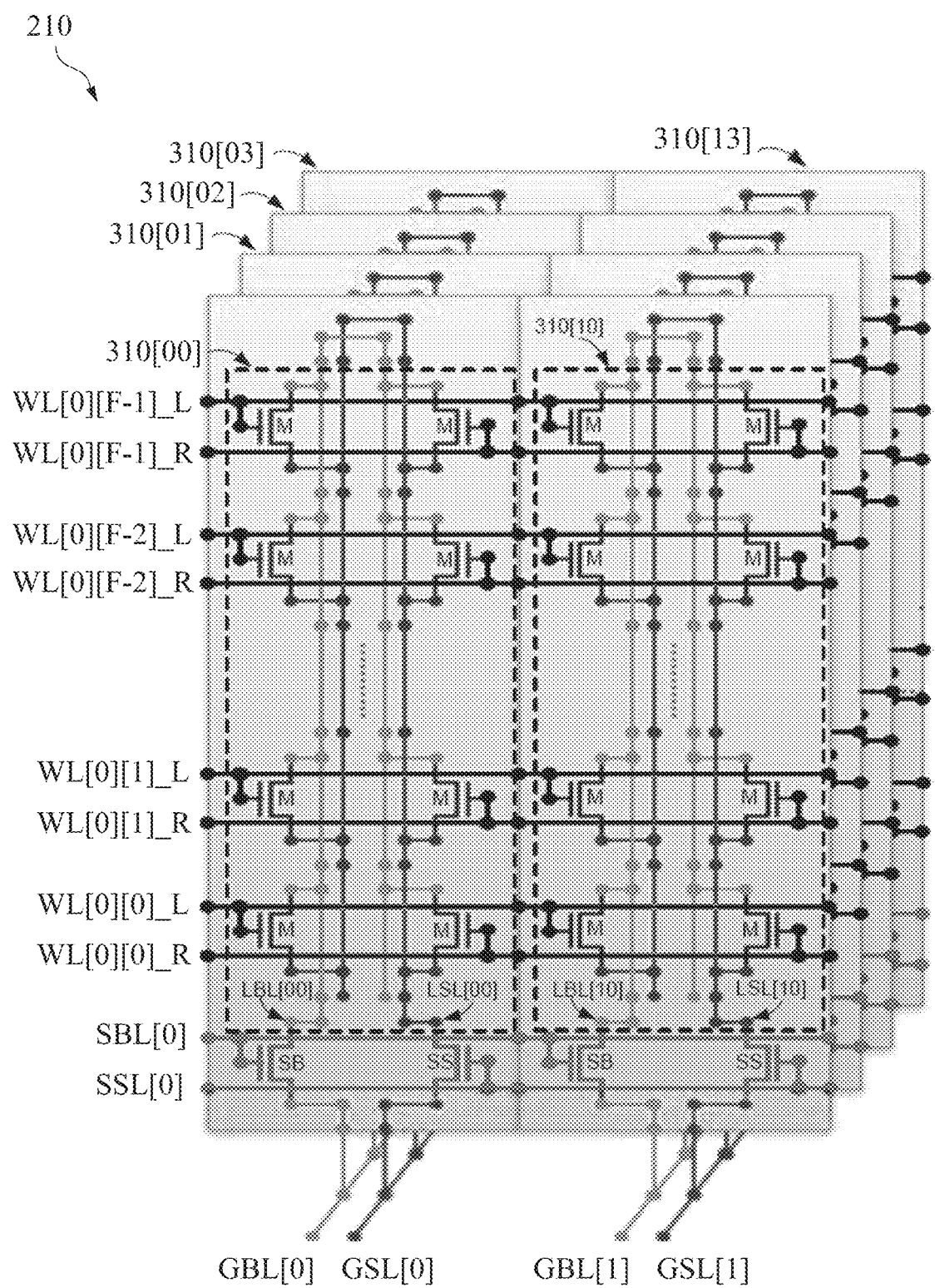
FIG. 3A is a diagram showing a portion of a three-dimensional memory array 210 including switches SS, SB arranged on the bottom-side and split word lines for reducing capacitive loading, in accordance with one embodiment.

FIG. 3A is a diagram showing a portion of a three-dimensional memory array 210 including switches SS, SB arranged on the bottom-side and split word lines for reducing capacitive loading, in accordance with one embodiment. In FIG. 3A, the memory array 210 includes a first set of memory cells and a second set of memory cells. In one configuration, the first set of memory cells includes subsets 310[00] . . . 310[03] of memory cells that may be electrically coupled to a global bit line GBL[0] and a global select line GSL[0] extending along a Y-direction. In one configuration, the second set of memory cells includes subsets 310[10] . . . 310[13] of memory cells that may be electrically coupled to a global bit line GBL[1] and a global select line GSL[1] extending along the Y-direction. Each subset 310 of memory cells may include F number of memory cells M (memory cell 125) disposed along a Z-direction, where F also corresponds to a total number of floors or layers in the memory array 210. Each set of memory cells may include a larger number of subsets 310 of memory cells than shown in FIG. 3A along the Y-direction. The memory array 210 may include a larger number of sets of memory cells than shown in FIG. 3A stacked along the X-direction. By arranging memory cells as shown in FIG. 3A, a storage density of the memory array 210 can be increased.

In one configuration, one or more memory cells of a subset 310 may be positioned on the left side of the subset 310 and the other memory cells of the subset 310 may be positioned on the right side of the subset 310. In one configuration, a subset 310 may include a first vertical string of memory cells disposed along a Z-direction and a second vertical string of memory cells disposed along the Z-direction, where the first vertical string and the second vertical string are in parallel with one another. Each memory cell may be identified (e.g., indexed, referenced, labeled, etc.) according to its position in a subset 310 and its X-Y-Z position in the memory array 210. For example, as shown in FIG. 3A, subset 310[00] includes M [0][0][0]_L, M [0][0][0]_R, M [0][0][1]_L, M [0][0][1]_R, M [0][0][F-2]_L, M [0][0][F-2]_R, M [0][0][F]_L, and M [0][0][F]_R; and subset 310[10] includes M [1][0][0]_L, M [1][0][0]_R, M [1][0][1]_L, M [1][0][1]_R, M [1][0][F-2]_L, M [1][0][F-2]_R, M [1][0][F]_L, and M [1][0][F]_R.

Each memory cell M may be a volatile memory cell, a non-volatile memory cell, or any memory cell that can store data. Each memory cell M may be embodied as a transistor, such as a metal-oxide-semiconductor field effect transistor (MOSFET), a gate-all-around FET (GAAFET), or a fin field-effect transistor (FinFET). Each memory cell M may include a first electrode (e.g., drain electrode) coupled to a local select line LSL[X][Y], a second electrode (e.g., source electrode) coupled to a local bit line LBL[X][Y], and a third electrode (e.g., gate electrode) coupled to a corresponding split word line (e.g., WL[X][Z]_L or word line WL[X][Z]_R). Each memory cell M may store data or conduct current according to a voltage applied to a gate electrode of the memory cell M.

In one configuration, a subset 310 of memory cells M are connected in parallel between a local select line LSL and a local bit line LBL. A local select line LSL may be a metal rail, at which first electrodes (e.g., drain electrodes) of a subset 310 memory cells are connected. A local bit line LBL may be a metal rail, at which second electrodes (e.g., source electrodes) of a subset 310 memory cells are connected. The local select line LSL may extend along the Z-direction and connect to a corresponding switch SS. Similarly, the local bit line LBL may extend along the Z-direction in parallel with the local bit line LBL and connect to a corresponding switch SB.

A word line WL[X][Y] may be split (e.g., divided, partitioned, separated, etc.) into a WL[X][Y]_L (left) and a WL[X][Y]_R (right) and extended along the X-direction to connect gate electrodes of corresponding memory cells M in different sets to the memory controller (e.g., gate line controller 114). In one configuration, a WL[X][Y]_L connects to the gate electrodes of memory cells M that are positioned on the left side of a subset 310 and a WL[X][Y]_R connects to the gate electrodes of memory cells M that are positioned on the right side of a subset 310. In one configuration, a WL[X][Y]_L connects to the gate electrodes of memory cells M that are positioned on the left side of a plurality of subsets (e.g., subset 310[00], 310[10]), and a WL[X][Y]_R connects to the gate electrodes of memory cells M that are positioned on the right side of a plurality of subsets (e.g., subset 310[00], 310[10]). In one configuration, a word line WL[X][Y] is split into two words lines (e.g., WL[X][Y]_L and WL[X][Y]_R) that are respectively dedicated to a memory cell M (left or right) from each subset 310 along the X-direction of the memory array 210.

For example, as shown in FIG. 3A, WL[0][0]_L connects to the gate electrode of M[0][0][0]_L (e.g., an M cell that is positioned on the left side of subset 310[00]) and the gate electrode of M[1][0][0]_L (e.g., an M cell that is positioned on the left side of subset 310[10]); WL[0][0]_R connects to the gate electrode of M[0][0][0]_R (e.g., an M cell that is positioned on the right side of subset 310[00]) and the gate electrode of M[1][0][0]_R (e.g., an M cell that is positioned on the right side of subset 310[10]); WL[0][1]_L connects to the gate electrode of M[0][0][1]_L and the gate electrode of M[1][0][1]_L; WL[0][1]_R connects to the gate electrode of M[0][0][1]_R and the gate electrode of M[1][0][1]_R; WL[0][F-2]_L connects to the gate electrode of M[0][0][F-2]_L and the gate electrode of M[1][0][F-2]_L; WL[0][F-2]_R connects to the gate electrode of M[0][0][F-2]_R and the gate electrode of M[1][0][F-2]_R; WL[0][F-1]_L connects to the gate electrode of M[0][0][F-1]_L and the gate electrode of M[1][0][F-1]_L; WL[0][F-1]_R connects to the gate electrode of M[0][0][F-1]_R and the gate electrode of M[1][0][F-1]_R.

In one configuration, although not shown in FIG. 3A, the connections of WL[X][Y]_L and WL[X][Y]_R may be reversed in that a WL[X][Y]_L connects to the gate electrodes of memory cells M that are positioned on the right side of a plurality of subsets (e.g., subset 310[00], 310[10]), and a WL[X][Y]_R connects to the gate electrodes of memory cells M that are positioned on the left side of a plurality of subsets (e.g., subset 310[00], 310[10]). For example, WL[0][0]_L connects to the gate electrode of M[0][0][0]_R (e.g., an M cell that is positioned on the right side of subset 310[00]) and the gate electrode of M[1][0][0]_R (e.g., an M cell that is positioned on the right side of subset 310[10]); WL[0][0]_R connects to the gate electrode of M[0][0][0]_L (e.g., an M cell that is positioned on the left side of subset 310[00]) and the gate electrode of M[1][0][0]_L (e.g., an M cell that is positioned on the left side of subset 310[10]), etc.

Splitting a word line WL[X][Y] into two words lines (e.g., WL[X][Y]_L and WL[X][Y]_R) may reduce the capacitive loading on a bit line (e.g., LBL[X][Y] or GBL[X][Y]), thereby allowing a memory array 210 to maintain the large cell bit count that may be needed for various memory applications (e.g., storage) and without additional processing cost.

Each switch SB may be embodied as a transistor (e.g., MOSFET, GAAFET, FinFET, etc.). Each switch SB may include a first electrode (e.g., drain electrode) connected to the local bit line LBL, a second electrode (e.g., source electrode) connected to a corresponding global bit line GBL, and a third electrode (e.g., gate electrode) connected to a corresponding switch control line SBL (sometimes referred to as, "select gate left" or "SG[X]_L"). The switch control line SBL may be a metal rail extending along the X-direction to connect the memory controller 105 (e.g., gate line controller 114) to the gate electrodes of switches SB. According to a voltage or a signal applied through the switch control line SBL, one or more switches SB connected to the switch control line SBL may be toggled (e.g., enabled or disabled). For example, in response to a voltage corresponding to logic state '1' provided through the switch control line SBL, a switch SB may be enabled to electrically couple (e.g., connect, engage, etc.) second electrodes (e.g., source electrodes) of the subset 310 of memory cells to the global bit line GBL. For example, in response to a voltage corresponding to logic state '0' provided through the switch control line SBL, the switch SB may be disabled to electrically decouple (e.g., disconnect, disengage, etc.) second electrodes (e.g., source electrodes) of the subset 310 of memory cells from the global bit line GBL.

Each switch SS may be embodied as a transistor (e.g., MOSFET, GAAFET, FinFET, etc.). The switch SS may include a first electrode (e.g., source electrode) connected to the local select line LSL, a second electrode (e.g., drain electrode) connected to a corresponding global select line GSL, and a third electrode (e.g., gate electrode) connected to a corresponding switch control line SSL (sometimes referred to as, "select gate right" or "SG[X]_R"). The switch control line SSL may be a metal rail extending along the X-direction to connect the memory controller 105 (e.g., gate line controller 114) to the gate electrodes of switches SS. According to a voltage or a signal applied through the switch control line SSL, one or more switches SS connected to the switch control line SSL may be enabled or disabled. For example, in response to a voltage corresponding to logic state '1' provided through a switch control line SSL, the switch SS may be enabled to electrically couple first electrodes (e.g., drain electrodes) of the subset 310 of memory cells to the global select line GSL. For example, in response to a voltage corresponding to logic state '0' provided through the switch control line SSL, the switch SS may be disabled to electrically decouple first electrodes (e.g., drain electrodes) of the subset 310 of memory cells from the global select line GSL.

In one configuration, the global select line GSL is a metal rail, at which corresponding switches SS are connected. The global select line GSL may extend along the Y-direction. In one implementation, the global select line GSL may be connected to a memory controller 105 (e.g., bit line controller 112). The global bit line GBL may be a metal rail, at which corresponding switches SB are connected. The global bit line GBL may extend along the Y-direction in parallel with the global select line GSL. In one implementation, the global bit line GBL may be connected to the memory controller 105 (e.g., bit line controller 112).

Figure 3B:
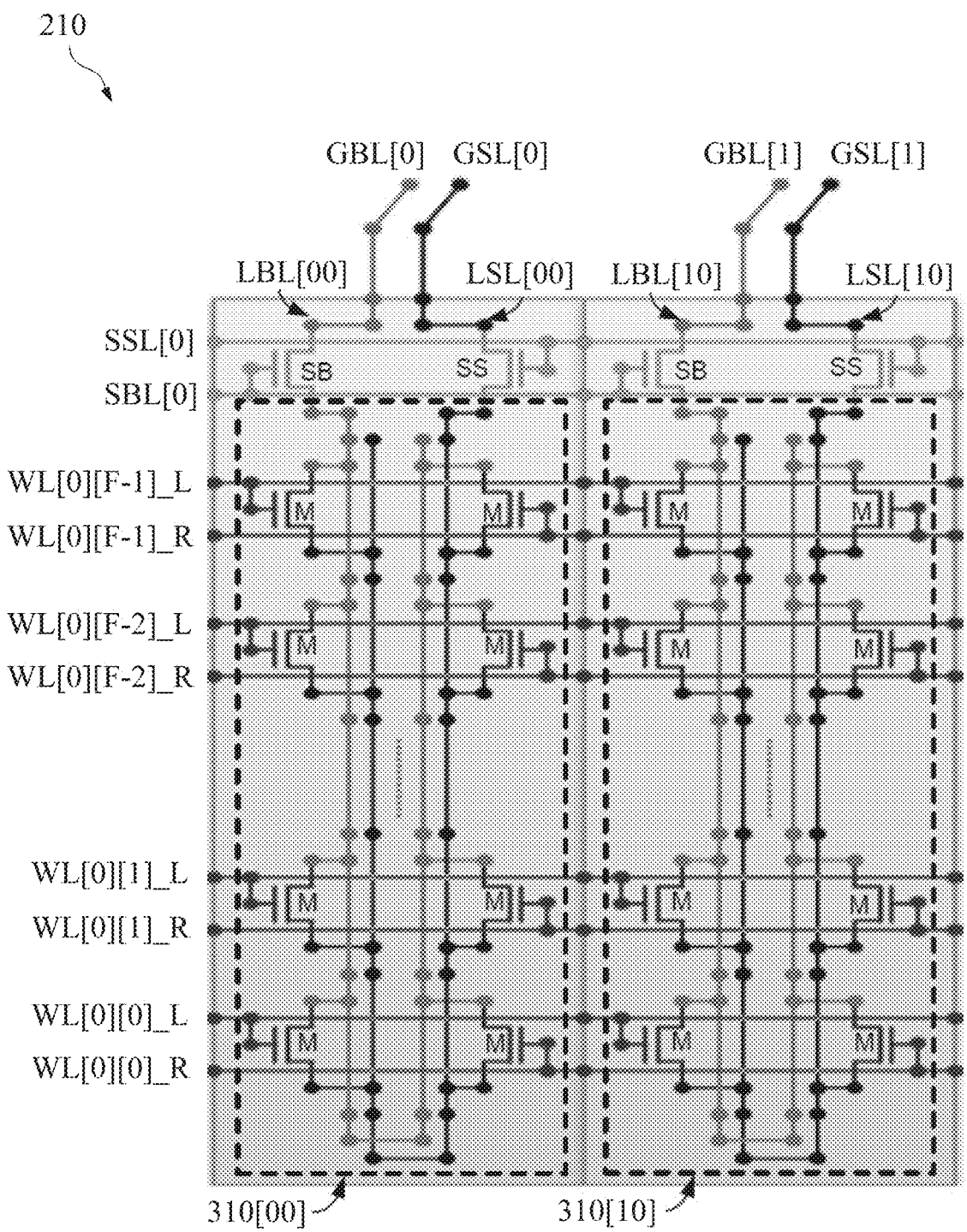
FIG. 3B is a diagram showing a portion of a three-dimensional memory array 210 including switches SS, SB arranged on the top-side and split word lines for reducing capacitive loading, in accordance with one embodiment.

Switches SB, SS are positioned on the same side of the memory array 210 to reduce processing cost and/or processing complexity. For example, as shown in FIG. 3A, switches SB, SS are positioned and/or arranged on the bottom-side of memory array 210. In one configuration, switches SB, SS may be positioned on the top-side of memory array 210. For example, FIG. 3B is a diagram showing a portion of a three-dimensional memory array 210 including switches SS, SB arranged on the top-side and split word lines for reducing capacitive loading, in accordance with one embodiment.

Referring back to FIG. 3A, in one configuration, the switches SB, SS can be operated or configured according to a voltage or signal from the memory controller 105 (e.g., gate line controller 114) to electrically couple (sometimes referred to as a, "coupling method") a subset 310 of memory cells to corresponding global lines BL, SL selectively. For example, from a set 310[X0] . . . 310[X3] of memory cells connected to local select lines LSL[X0] . . . LSL[X3] and local bit lines LBL[X0] . . . LBL[X3], a subset 310[XY] of memory cells connected to a local select line LSL[XY] and a local bit line LBL[XY] can be electrically coupled to the global bit line GBL[X] and the global select line GSL[X] through selected switches SB, SS. Meanwhile, other subsets 310 of memory cells connected to other local select lines LSL and local bit lines LBL can be electrically decoupled (sometimes referred to as a, "decoupling method") from the global bit line GBL[X] and the global select line GSL[X]. By electrically coupling a selected subset 310[XY] of memory cells to the global bit line GBL[X] and the global select line GSL[X] through the switches SB, SS, the global bit line GBL[X] and the global select line GSL[X] may have a capacitive loading corresponding to the selected subset 310[XY] of memory cells instead of the set 310[X1] . . . 310[X3] (e.g., a plurality or all) of memory cells. Accordingly, the global bit lines GBL[X] and the global select lines GSL[X] may be implemented to provide voltages or current, without increased capacitive loading.

A split word line allows the controller 105 to access (e.g., read, write, program) a single vertical string of a memory cells in subset 310 without having to access all the vertical strings of memory cells in the subset 310. For example, subset 310[00] may include a first vertical string of memory cells (e.g., M[0][0][0]_L, M[0][1][0]_L, M[0][F-2][0]_L, M[0][F-1][0]_L) that are disposed along the Z-direction, where each memory cell M of the first vertical string has its gate electrode coupled to a corresponding word line WL[X]

[Z]_L (left); and a second vertical string of memory cells (e.g., M[0][0][0]_R, M[0][1][0]_R, M[0][F-2][0]_R, M[0][F-1][0]_R) disposed along the Z-direction, where each memory cell M of the second vertical string has its gate electrode coupled to a corresponding word line WL[X][Z]_R (right). In this configuration, the memory controller 105 can (1) select the subset 310[00] of memory cells via the switches SB, SS using the "coupling" method as discussed herein, and (2) deselect the other subsets 310 of memory cells via switches SB, SS using the "decoupling method" as discussed herein. In response to selecting/deselecting the subsets 310 of memory cells, the controller 105 can access the first vertical string of memory cells using via word lines WL[X][Y]_L (left) without having to also access the second vertical string of memory cells in the subset 310. Accordingly, splitting a word line WL[X][Y] into two words lines (e.g., WL[X][Y]_L and WL[X][Y]_R) may further help to reduce the capacitive loading on a word line WL[X][Y], thereby allowing the controller 105 and/or memory cells M to be operated or configured with improved speed and/or lower power consumption.

In some embodiments, the memory array 210 includes either one of the switches SB, SS, but may lack the other of the switches SB, SS. For example, the memory array 210 includes the switches SB as shown in FIG. 3A, where the switches SS are omitted and local select lines LSL [X0], [X1], [X2], [X3] are connected to corresponding global select lines SL[X]. For example, the memory array 210 includes the switches SS as shown in FIG. 3A, where the switches SB are omitted and local bit lines LBL [X0], [X1], [X2], [X3] are connected to corresponding global bit lines GBL[X]. The switches SS or SB can be configured or operated to electrically couple or decouple the subset 310 of memory cells to a corresponding global line selectively. In some embodiments, the memory array 210 may include split word lines WL and either one of the switches SB, SS, but may lack the other of the switches SB, SS.

Figure 4A:
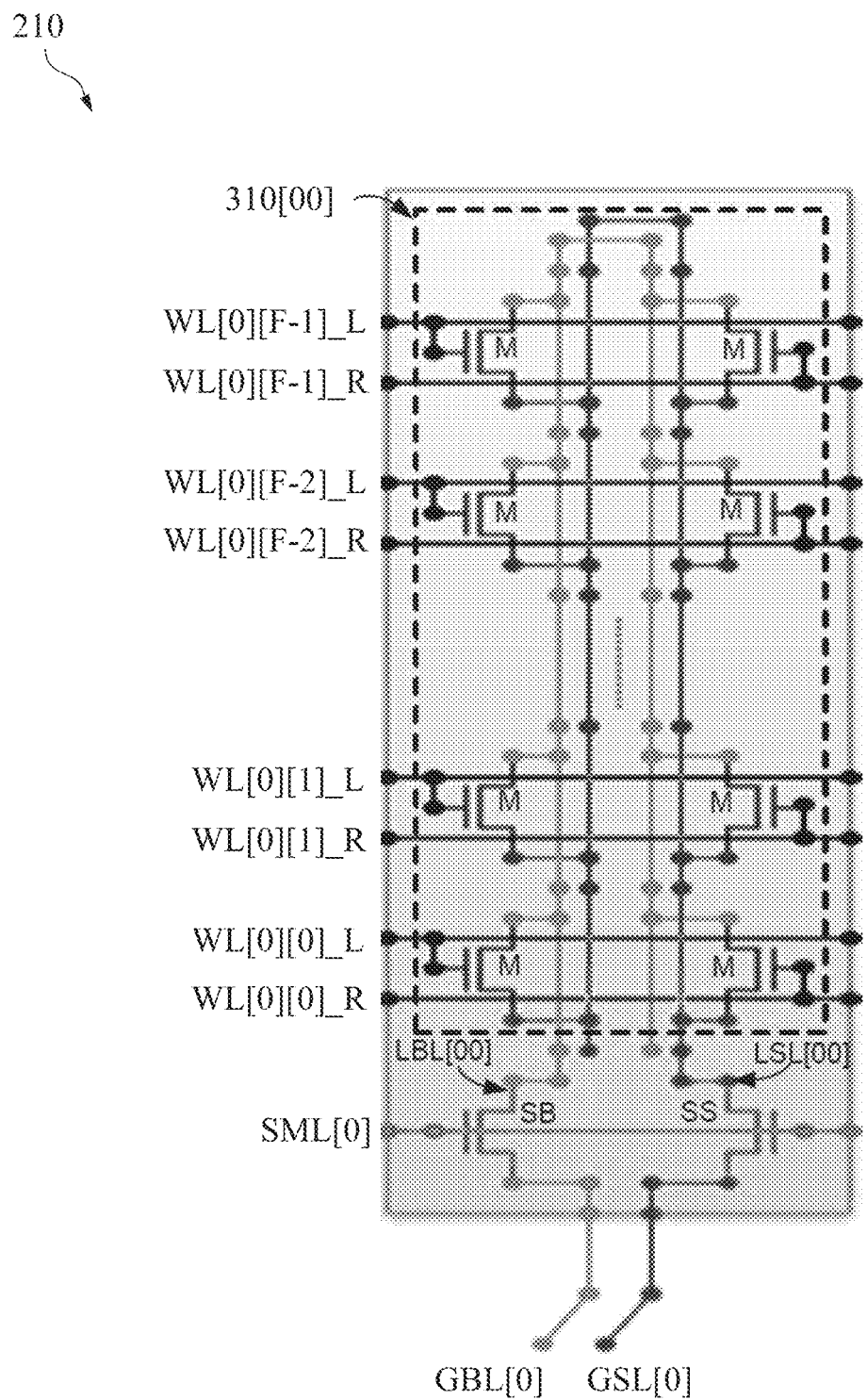
FIG. 4A is a diagram showing a portion of a three-dimensional memory array 210 including switches SS, SB arranged on the bottom-side, split word lines, and merged switches SB, SS for reducing capacitive loading, in accordance with one embodiment.
Figure 4B:
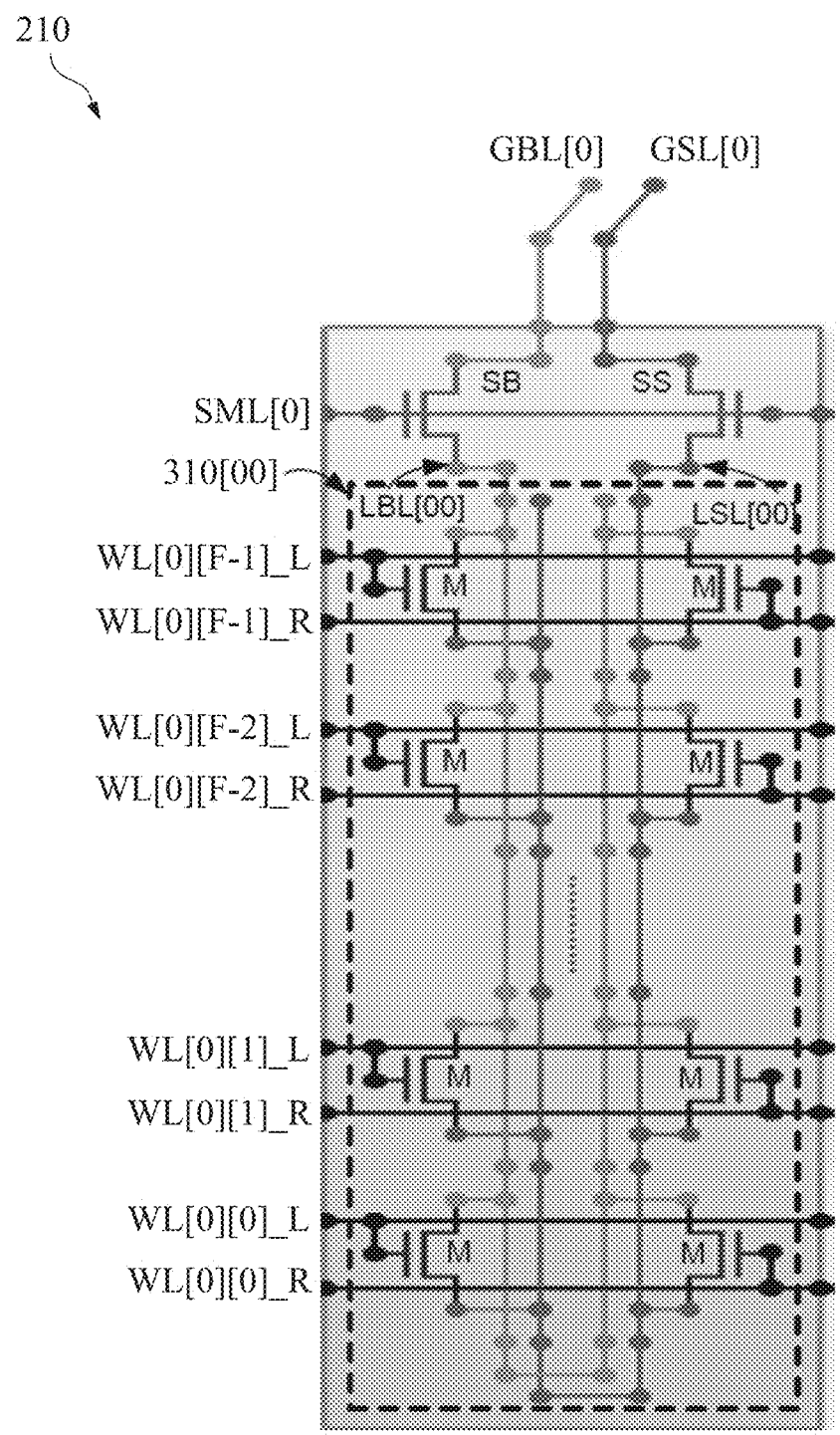
FIG. 4B is a diagram showing a portion of a three-dimensional memory array 210 including switches SS, SB arranged on the top-side, split word lines, and merged switches SB, SS for reducing capacitive loading, in accordance with one embodiment.

In one configuration, the gate electrode of a switch SB of a subset 310 of memory cells may be electrically coupled to the gate electrode of the corresponding switch SS. In other words, the switch SB and/or its respective functionality may be merged with the switch SS and/or its respective functionality. For example, FIG. 4A is a diagram showing a portion of a three-dimensional memory array 210 including switches SS, SB arranged on the bottom-side, split word lines, and merged switches SB, SS for reducing capacitive loading, in accordance with one embodiment. As another example, FIG. 4B is a diagram showing a portion of a three-dimensional memory array 210 including switches SS, SB arranged on the top-side, split word lines, and merged switches SB, SS for reducing capacitive loading, in accordance with one embodiment. As shown in FIGS. 4A and 4B, when the gate electrodes of the switches SB, SS are electrically coupled together (merged), then the corresponding switch control lines SSL[Y], SBL[Y] may be merged into a single control line (shown in FIG. 4B as, switch merged control line or SML[0]) that is connected to a single driver. Accordingly, the switches SB, SS connected to the SML[0] can be simultaneously (or nearly simultaneously) enabled or disabled according to a voltage, current, or pulse from the driver. By implementing the same (single) driver to configure or operate the switches SB, SS, several drivers can be reduced to achieve area efficiency.

In some embodiments, the M cells and switches SB,SS in the memory array 210 depicted in any of FIG. 3A, FIG. 3B, FIG. 4A, FIG. 4B may be embodied as P-type metal-oxide-semiconductor field effect transistors (PMOS). In some embodiments, the M cells and switches SB,SS in the memory array 210 depicted in any of FIG. 3A, FIG. 3B, FIG. 4A, FIG. 4B may be embodied as N-type metal-oxide-semiconductor field effect transistors (NMOS).

Figure 5:
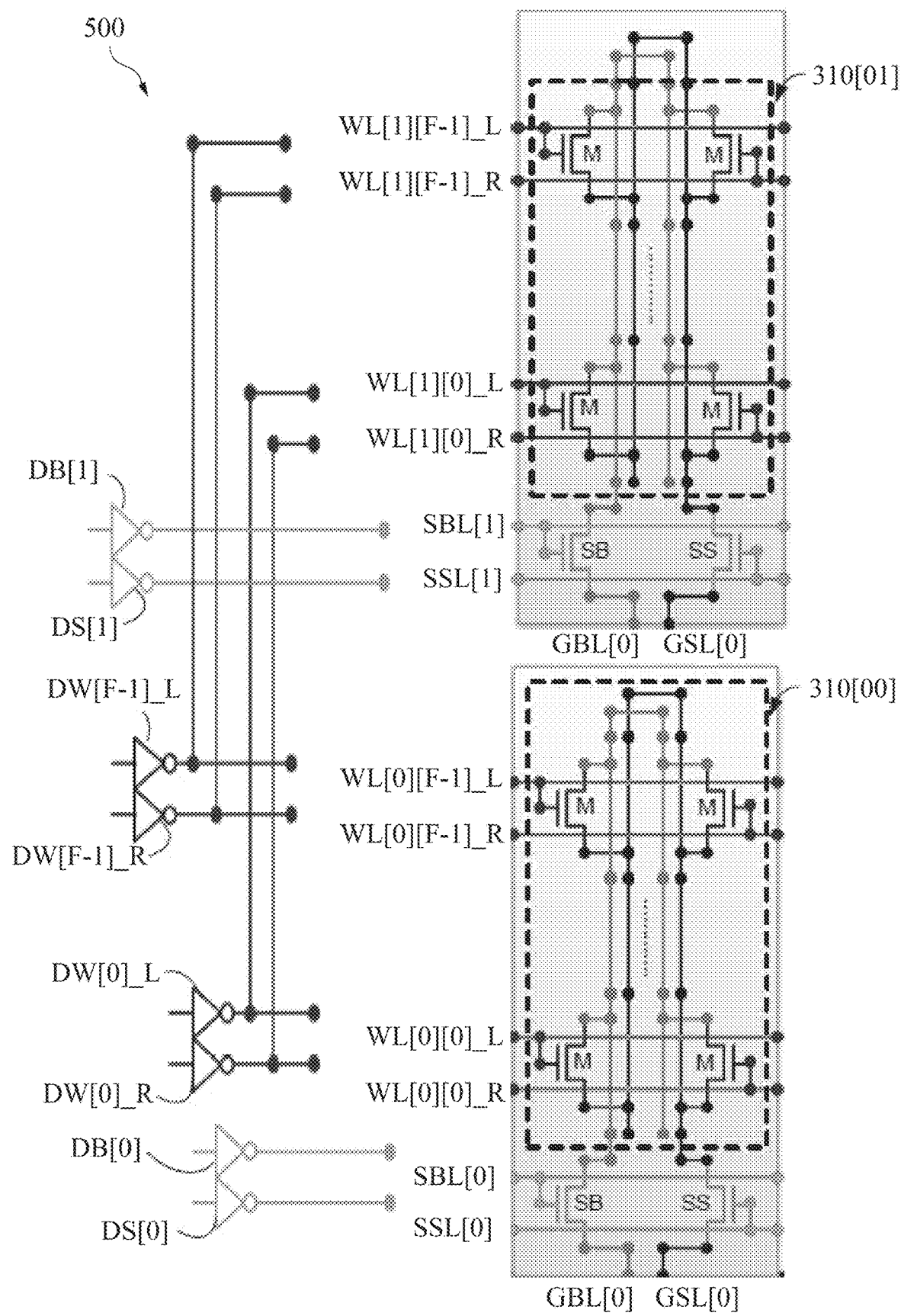
FIG. 5 is a diagram showing drivers to drive one or more switches, in accordance with an embodiment of the present disclosure.

FIG. 5 is a diagram showing drivers to drive one or more switches, in accordance with an embodiment of the present disclosure. The diagram 500 includes drivers DS[0], DB[0], DS[1], DB[1], DW[0]_L . . . DW[F-1]_L, and DW[0]_R . . . DW[F-1]_R. The drivers DS[0], DB[0], DS[1], DB[1], DW[0]_L . . . DW[F-1]_L, and DW[0]_R . . . DW[F-1]_R may be part of the gate line controller 114. In one aspect, the drivers DS[0], DB[0], DS[1], DB[1], DW[0]_L . . . DW[F-1]_L, and/or DW[0]_R . . . DW[F-1]_R are connected to two or more switches or two or more memory cells to achieve area efficiency.

In one configuration, the gate electrode of the switch SS connected to a subset 310[01] of memory cells is connected to an output of a driver DS[1] through switch control line SSL[1]. In one configuration, the gate electrode of the switch SS connected to a subset 310[00] of memory cells is connected to an output of a driver DS[0] through switch control lines SSL[0]. In one configuration, the gate electrode of the switch SB connected to a subset 310[01] of memory cells is connected to an output of a driver DB[1] through switch control line SBL[1]. In one configuration, the gate electrode of the switch SB connected to a subset 310[00] of memory cells is connected to an output of a driver DB[0] through switch control lines SBL[0].

In one configuration, a gate electrode of each memory cell in the subset 310[00] of memory cells and a gate electrode of a corresponding memory cell in the subset 310[01] of memory cells are connected to an output of a driver DW[X]_L or DW[X]_R through word lines WL. For example, a gate electrode of a first memory cell that is positioned on the left side in the subset 310[00] of memory cells and a gate electrode of a first memory cell that is positioned on the left side in the subset 310[01] of memory cells are connected to an output of the driver DW[0]_L through word lines WL[0][0]_L, WL[1][0]_L. As another example, a gate electrode of a first memory cell that is positioned on the right side in the subset 310[00] of memory cells and a gate electrode of a first memory cell that is positioned on the right side in the subset 310[01] of memory cells are connected to an output of the driver DW[0]_R through word lines WL[0][0]_R, WL[1][0]_R. As another example, a gate electrode of a Fth memory cell that is positioned on the left side in the subset 310[00] of memory cells and a gate electrode of a Fth memory cell that is positioned on the left side in the subset 310[01] of memory cells are connected to an output of the driver DW[F-1]_L through word lines WL[0][F-1]_L, WL[1][F-1]_L. As another example, a gate electrode of a Fth memory cell that is positioned on the right side in the subset 310[00] of memory cells and a gate electrode of a Fth memory cell that is positioned on the right side in the subset 310[01] of memory cells are connected to an output of the driver DW[F-1]_R through word lines WL[0][F-1]_R, WL[1][F-1]_R. Although two subsets 310[01], 310[00] of memory cells are shown in FIG. 5, the output of each driver (e.g., DW_L and/or DW_R) may be connected to additional memory cells in other subsets (e.g., 310[02], 310[03]) through word lines.

Without implementing the disclosed switches SS, SB and sharing drivers (e.g., DS, DB, DW_L, and/or DW_R), a number of drivers may correspond to a number of total memory cells in a set of memory cells. By sharing a driver (e.g., DS, DB, DW_L, and/or DW_R) to drive multiple memory cells in different subsets 310 of memory cells, several drivers can be reduced to achieve area efficiency. Hence, 68% of area reduction can be achieved by sharing drivers.

Figure 6:
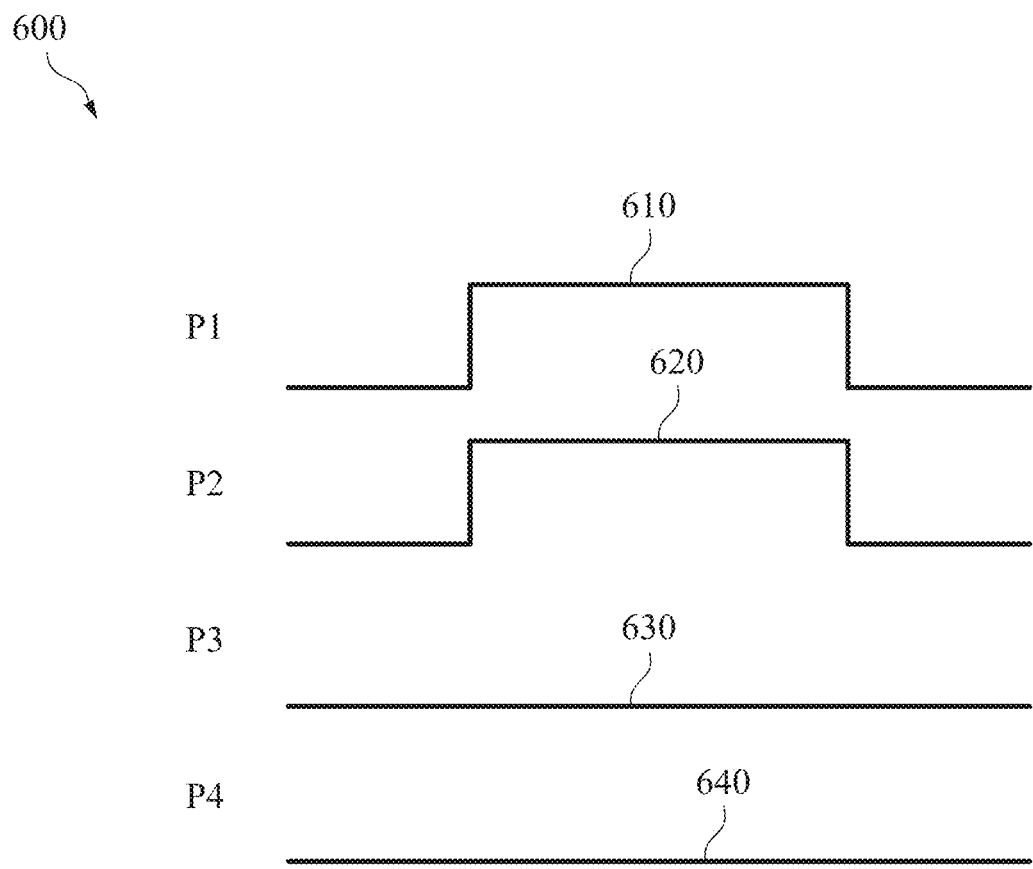
FIG. 6 is a diagram showing pulses applied to switches of memory arrays, in accordance with an embodiment of the present disclosure.

FIG. 6 is a timing diagram 600 showing pulses P1, P2, P3, P4 for operating the memory array 120, in accordance with one embodiment. In some embodiments, the pulses P1, P2, P3, P4 are generated by the memory controller 105 (e.g., gate line controller 114).

In one approach, the pulse P1 is applied to gate electrodes of switches SS, SB connected to a selected subset 310 of memory cells, and the pulse P3 is applied to gate electrodes of switches SS, SB connected to unselected subsets 310 of memory cells. By applying the pulse P1 having a high voltage 610, the switches SS, SB connected to the selected subset 310 of memory cells can be enabled to electrically couple the selected subset 310 of memory cells to the global select line GSL and the global bit line GBL. Meanwhile, by applying the pulse P3 having a low voltage 630, the switches SS, SB connected to the unselected subsets 310 of memory cells can be disabled to electrically decouple the unselected subset 310 of memory cells from the global select line GSL and the global bit line GBL. Accordingly, the global select line GSL and the global bit line GBL may have a capacitive loading corresponding to the selected subset of memory cells, rather than the entire set of memory cells.

In one approach, the pulse P2 is applied to a gate electrode or a word line WL of a selected memory cell, and the pulse P4 is applied to gate electrodes or word lines WL of unselected memory cells. For example, P2 may be applied to WL[X][Z]_L when a first vertical string (e.g., leftmost) of a subset 310 is selected and P4 may be applied to WL[X][Z]_R when a second vertical string (e.g., rightmost) of a subset 310 is deselected. As another example, P2 may be applied to WL[X][Z]_R when a second vertical string (e.g., rightmost) of a subset 310 is selected and P4 may be applied to WL[X][Z]_L when a first vertical string (e.g., leftmost) of a subset 310 is deselected.

In some embodiments, P1 may have a pulse-width (e.g., an elapsed time between the rising edge and falling edge of a pulse) that is wider than the pulse-width of P2. In some embodiments, P1 may have a pulse-width (e.g., an elapsed time between the rising edge and falling edge of P1) that is shorter than the pulse-width of P2. In one embodiment, P1 may have a pulse-width (e.g., an elapsed time between the rising edge and falling edge of P1) that is the same as the pulse-width of P2.

In some embodiments, the rising edge and/or falling edge of P1 may be coincident with the rising edge and/or falling edge of P2. In some embodiments, the rising edge and/or falling edge of P1 may be delayed with respect to the corresponding rising edge and/or corresponding falling edge of P2. In some embodiments, the rising edge and/or falling edge of P1 may be advanced with respect to the corresponding rising edge and/or corresponding falling edge of P2.

By applying the pulse P2 having a high voltage 620, the selected memory cell may be programmed or conduct current corresponding to programmed data. Meanwhile, by applying the pulse P4 having a low voltage 640, the unselected memory cells can be disabled from being programmed or conducting current. Accordingly, the selected memory cell from a subset 310 of memory cells can be individually programmed or operated.

Figure 7:
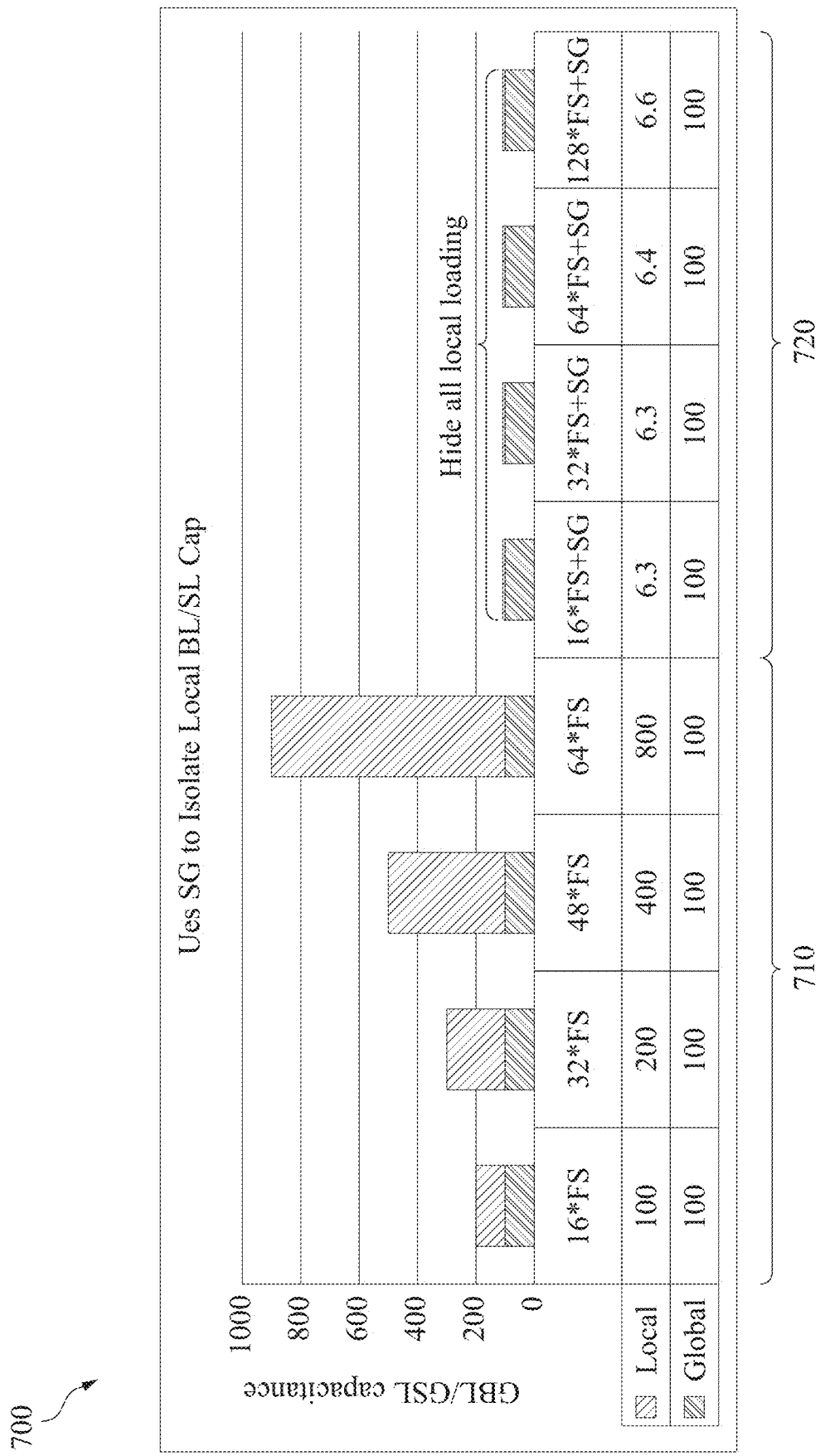
FIG. 7 is a graph showing effects of reduced capacitive loading due to switches, in accordance with an embodiment of the present disclosure.

FIG. 7 is a graph 700 showing effects of reduced capacitive loading due to switches SS, SB, in accordance with one embodiment. F may indicate several memory cells in a subset of memory cells along the Z-direction. S may indicate several sets of memory cells along the X-direction (or a number of global select lines GSL). In one aspect, without implementing the disclosed switches SS, SB and/or split word lines, capacitive loading at global lines may increase according to a number of subsets of memory cells, as shown in cases 710. For example, without the disclosed switches SS, SB and/or split word lines, the global lines may have a high capacitance loading, if a memory array 210 includes 64 number of subsets of memory cells. By implementing the switches SW (e.g., SS, SB) and/or split word lines, capacitive loadings at global lines may not increase despite the increased number of subsets of memory cells, as shown in cases 720. For example, a global line may have a capacitive loading corresponding to a selected subset 310 of memory cells by enabling switches SS, SB connected to the selected subset 310 of memory cells and disabling switches SS, SB connected to the unselected subsets 310 of memory cells. Accordingly, the increased number of subsets of memory cells may not affect the capacitive loading at the global lines.

Figure 8A:
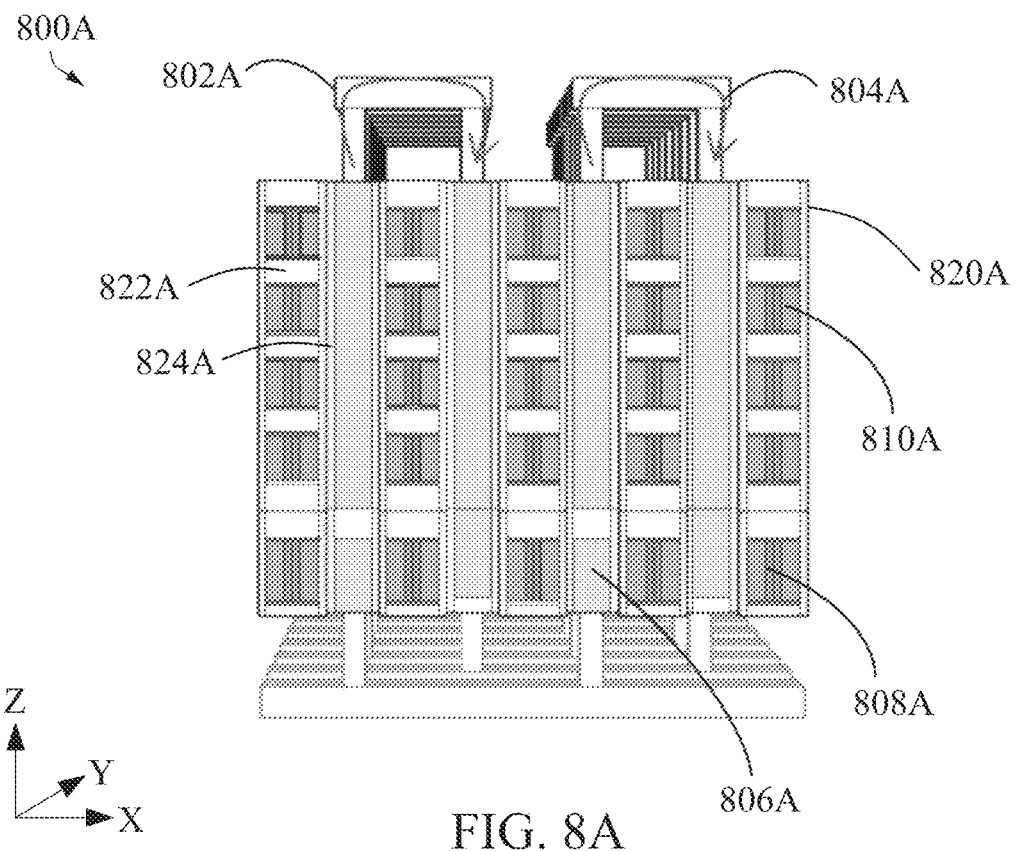
FIG. 8A is a diagram showing an example implementation of a memory array having GSL/GBL connections and single-side switches SS, SB, in accordance with one embodiment.

FIG. 8A is a diagram showing an example implementation of a memory array having GSL/GBL connections and single-side switches SS, SB, in accordance with one embodiment. As shown in FIG. 8A, a memory array 800A includes a structure 802A (e.g., S/BL connect) implemented for a global bit line GBL connection. The memory array 800A includes a structure 804A (e.g., S/BL connect) implemented for a global select line GSL connection. The memory array 800A may also include a structure 806A (e.g., SL/BL) implemented for a switch (SS, SB), such as a transistor channel. As shown, the switches are positioned on the bottom-side of the memory array 800A. The memory array 800A may also include a structure 808A (e.g., inter connect) implemented for a non-split word line. The memory array 800A may also include a structure 810A (e.g., WL) implemented for a bit cell, such as a transistor. The memory array 800A may also include a structure 820A corresponding to a ferroelectric (FE) film. The memory array 800A may also include a structure 822A corresponding to oxide (e.g., $SiO_2$). The memory array 800A may also include a structure 824A implemented for a channel. In this configuration, the memory array 800A may have a cell count corresponding to the following equation:

$$\text{Cell count} = \text{Row Count} * 1/2 * \text{Column Count} * \text{Floor Count} \qquad (1)$$

where a Row Count corresponds to the number of rows (y-direction) in the memory array, a Column Count corresponds to the number of columns (x-direction) in the memory array, and a Floor Count corresponds to the number of floors (z-direction) in the memory array.

In some embodiments, WL is defined as a word-line for Vg. In some embodiments, the size of a WL in the z-direction may be 20 nanometers to 120 nanometers. In some embodiments, S/BL is defined as a source-line/bit-line for a first power rail (e.g., VDD) and a second power rail (e.g., ground). In some embodiments, OX is defined as oxide for isolation. In some embodiments, FE is defined as ferroelectric film of memory. In some embodiments, an FE has a thickness of 5 nanometers to 30 nanometers. In some embodiments, a channel corresponds to a channel film of memory. In some embodiments, a channel may have a thickness of 5 nanometers to 30 nanometers. In some embodiments, S/BL corresponds to an interconnect.

Figure 8B:
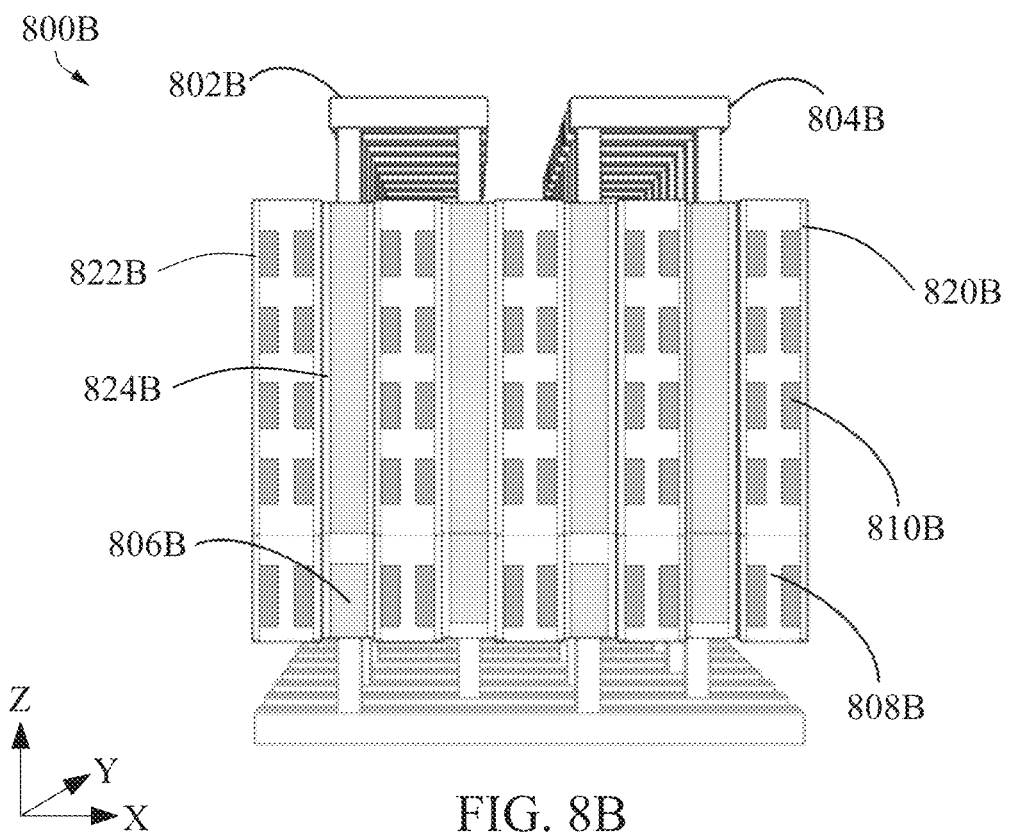
FIG. 8B is a diagram showing an example implementation of a memory array having GSL/GBL connections and single-side switches SS, SB, in accordance with one embodiment.

FIG. 8B is a diagram showing an example implementation of a memory array having GSL/GBL connections and single-side switches SS, SB, in accordance with one embodiment. As shown in FIG. 8B, a memory array 800B includes a structure 802B implemented for a global bit line GBL connection. The memory array 800B includes a structure 804B implemented for a global select line GSL connection. The memory array 800B may also include a structure 806B implemented for a switch (SS, SB), such as a transistor channel. As shown, the switches are positioned on the bottom-side of the memory array 800B. The memory array 800B may also include a structure 808B (e.g., inter connect) implemented for a split word line (e.g., a word line that is split into a first word line and a second word line). The memory array 800B may also include a structure 810B (e.g., WL) implemented for a bit cell, such as a transistor. The memory array 800B may also include a structure 820B corresponding to iron (FE). The memory array 800B may also include a structure 822B corresponding to oxide (e.g., SiO2). The memory array 800B may also include a structure 824B implemented for a channel. In this configuration, the memory array 800B may have a cell count corresponding to the following equation:

Cell count=Row Count*Column Count*Floor Count (2)

Figure 8C:
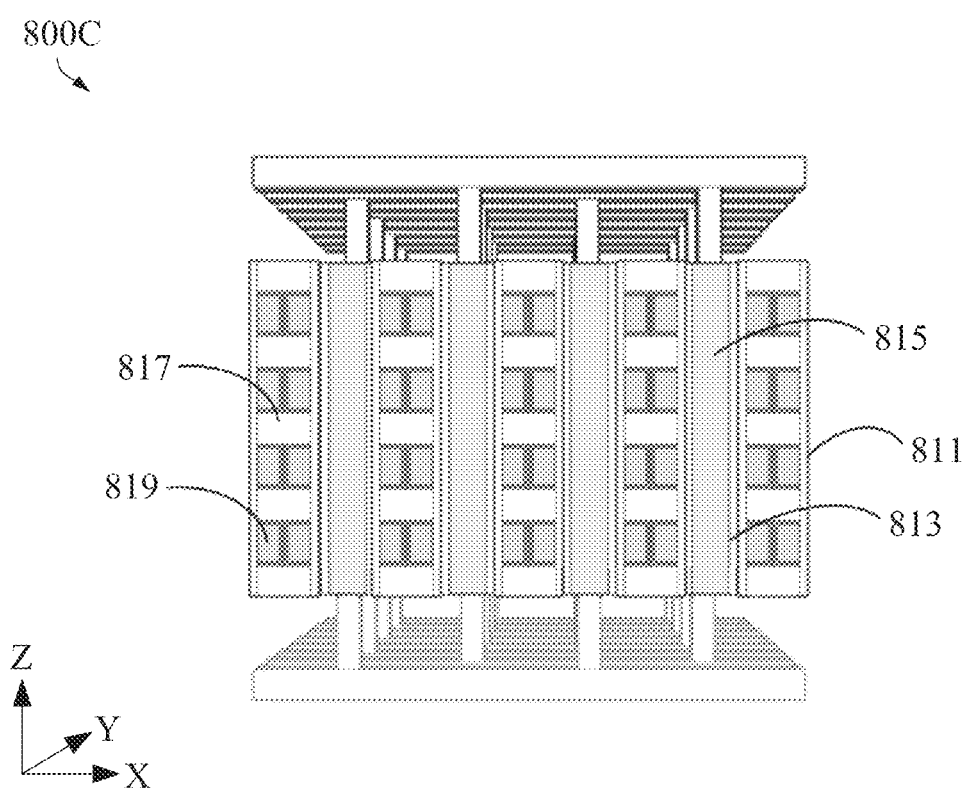
FIGS. 8C-8D are diagrams showing example implementations of memory arrays, in accordance with some embodiments.
Figure 8D:
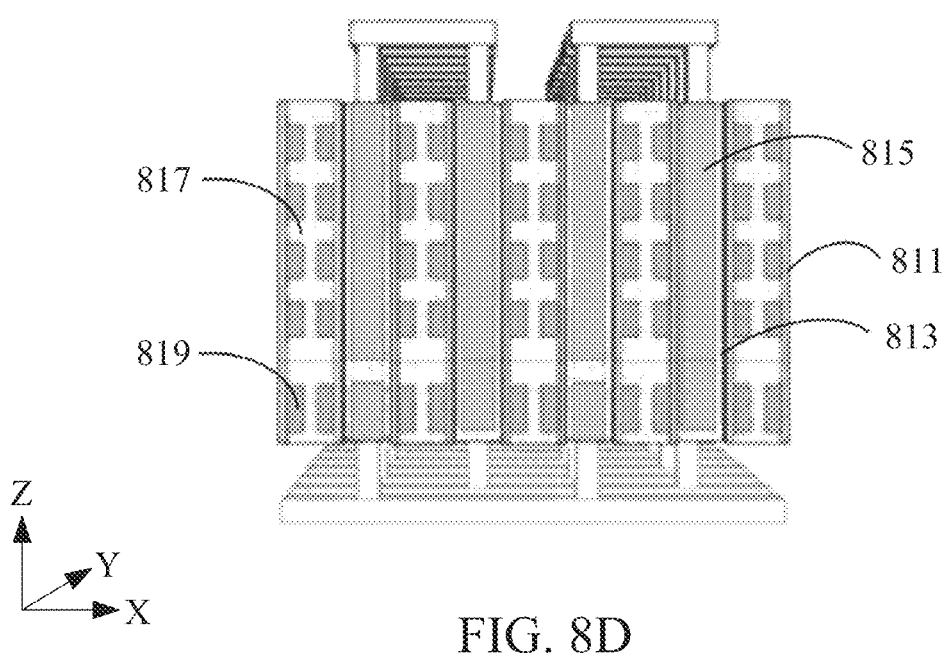

FIGS. 8C-8D are diagrams showing example implementations of memory arrays, in accordance with some embodiments. The memory arrays 800C and 800D include a structure 811 that may include iron (FE). The memory arrays 800C and 800D include a structure 813 that may correspond to a channel. The memory arrays 800C and 800D include a structure 815 that may correspond to a select line SL (or global select line GSL) and/or a bit line BL (or global bit line GBL). The memory arrays 800C and 800D include a structure 817 that may include oxide. The memory arrays 800C and 800D include a structure 819 that may correspond to a word line WL.

In one embodiment, a process flow for building a memory array having GSL/GBL connections and single-side switches SS, SB may include the following operations: stacking, cell area dry etching, replacement silicon nitride (SiN), word line WL metal filling, iron (FE)/channel/oxide deposition, formation of global select line GSL and global bit line GNL, and contact/via. In one embodiment, a process flow may include the following operations: stacking, cell area dry etching, replacement SiN, oxide filling (for split word lines WL), word line WL metal filling, FE/channel/ oxide deposition, formation of global select line GSL and global bit line GBL, and contact/via. In one embodiment, a process flow may include the following operations: stacking, cell area dry etching, replacement SiN with less length, word line WL metal filling, FE/channel/oxide deposition, formation of global select line GSL and global bit line GNL, and contact/via. In one embodiment, a process flow may be modified and/or adjusted to include additional oxide filling before word line WL metal to split the word line WL. In one embodiment, a process flow may be modified and/or adjusted to include a replacement SiN removal with less length.

Figure 8E:
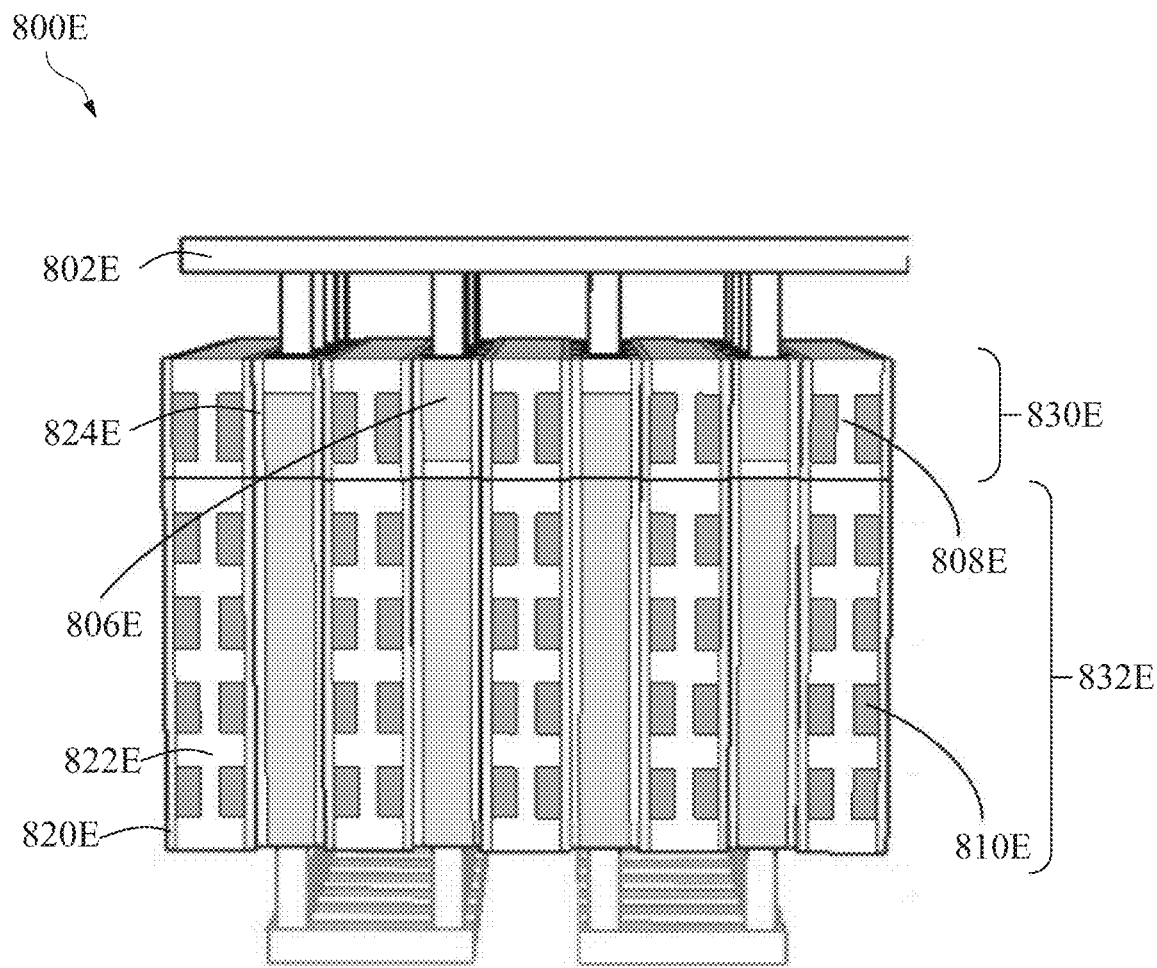
FIG. 8E is a diagram showing an example implementation of a memory array having GSL/GBL connections and single-side switches SS, SB positioned on the top-side of the memory array, in accordance with one embodiment.

FIG. 8E is a diagram showing an example implementation of a memory array having GSL/GBL connections and single-side switches SS, SB positioned on the top-side of the memory array, in accordance with one embodiment. The memory array 800E includes a structure 802E (e.g., S/BL connect) implemented for a global bit line GBL connection. The memory array 800E includes a structure 804E (e.g., S/BL connect) implemented for a global select line GSL connection. The memory array 800E may include a structure 806E (e.g., SL/BL) implemented for a switch (SS, SB), such as a transistor channel. As shown, the switches are positioned on the top-side of the memory array 800E. The memory array 800E may also include a structure 808E implemented for a split word line (e.g., a word line that is split into two word lines). The memory array 800E may also include a structure 810E implemented for a bit cell, such as a transistor. The memory array 800E may also include a structure 820E corresponding to iron (FE). The memory array 800E may also include a structure 822E corresponding to oxide (e.g., SiO2). The memory array 800E may also include a structure 824E implemented for a channel. The memory array 800E includes a selection region 830E and a memory cell region 832E.

Figure 8F:
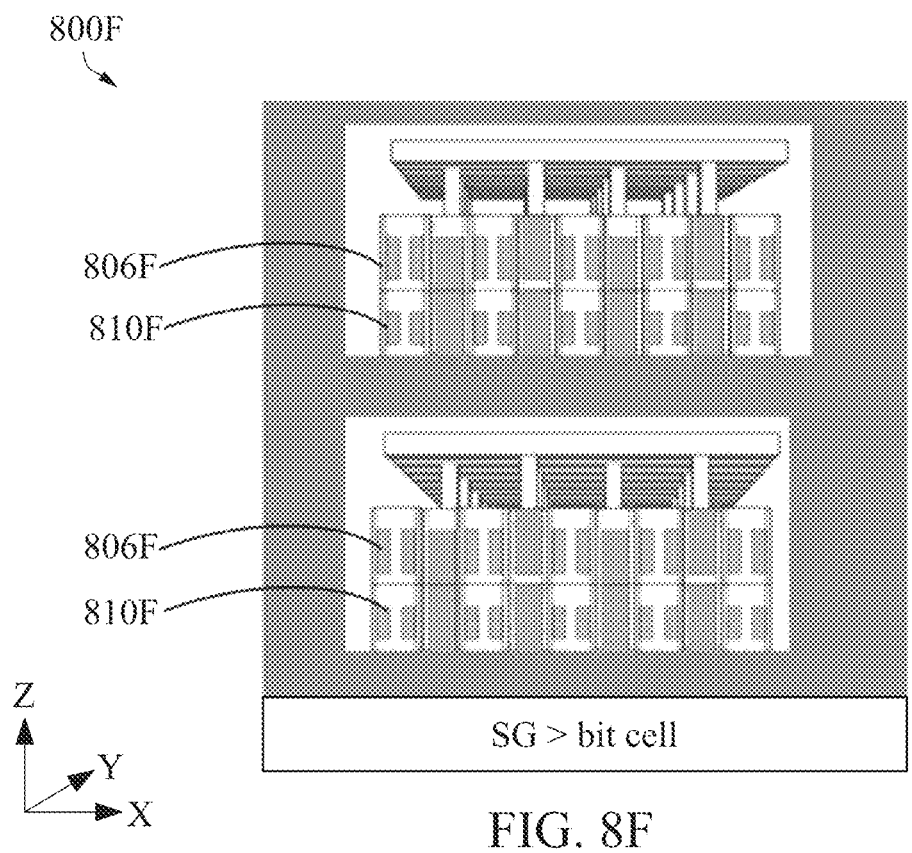
FIGS. 8F-8G are diagrams showing example implementations of memory arrays having different size switches SB, SS in relation to a bit cell size for different applications, in accordance with some embodiments.
Figure 8G:
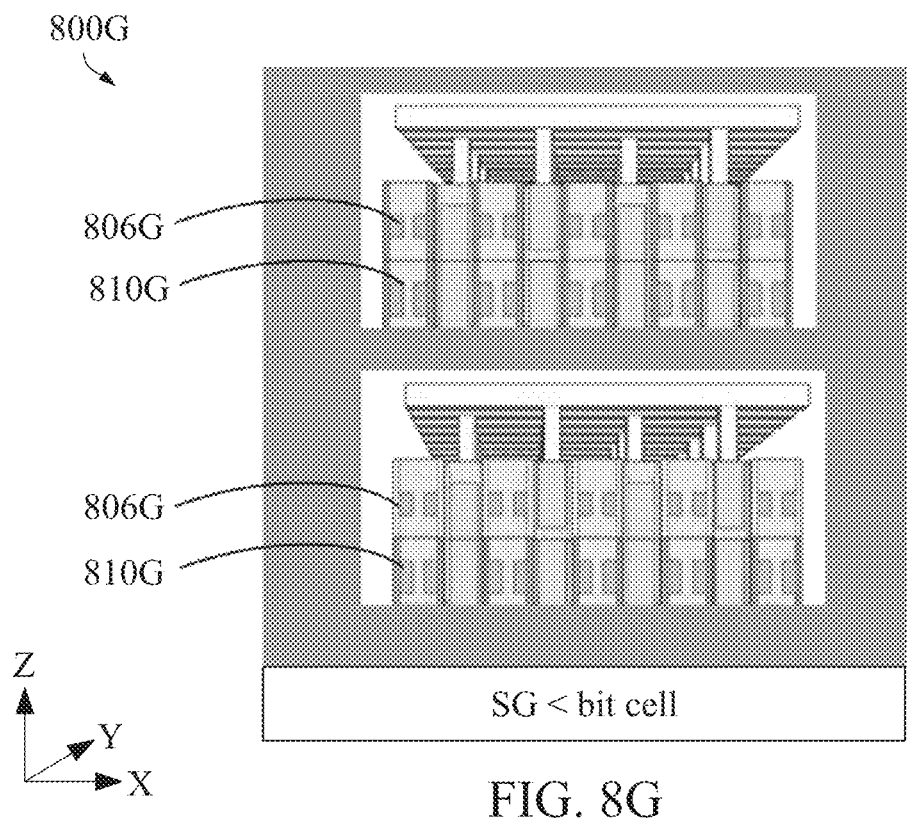

FIGS. 8F-8G are diagrams showing example implementations of memory arrays having different size switches (SB, SS) in relation to the bit cell for different applications, in accordance with some embodiments. The memory arrays 800F and 800G include structures 806F (e.g., a SG WL) and 806G, respectively, implemented for a select gate (e.g., switches SS, SB). The memory arrays 800F and 800G may also include structures 810F (e.g., Cell WL) and 810G, respectively implemented for a bit cell.

As shown in FIG. 8F, the size of the structure 806F of the select gate (e.g., switch SB, SS) in the vertical dimension (e.g., z-dimension) is larger than the size of the structure 810F of the bit cell in the vertical dimension, in accordance with one embodiment. For example, the size of the structure 806F of the select gate (e.g., switch SB, SS) in the vertical dimension (e.g., z-dimension) may be 1.5 to 3 times larger than the size of the structure 810F of the bit cell in the vertical dimension. In this configuration, the select gate may have a thinner oxide (e.g., SiO2) for HP application and/or be changed to LK oxide. In some embodiments, an HP application is defined as an HPC product, which require high bandwidth, high capacity for data storage, such as AI computing device.

As shown in FIG. 8G, the size of the structure 806G of the select gate (e.g., switch SB, SS) in the vertical dimension (e.g., z-dimension) is smaller than the size of the structure 810G of the bit cell in the vertical dimension, in accordance with one embodiment. For example, the size of the structure 806G of the select gate in the vertical dimension may be 0.5× to 0.2× of the size of the structure 810G of the bitcell in the vertical dimension. In this configuration, the select gate may have a thicker oxide (e.g., $SiO_2$) for HV application and/or the select gate material may be changed to any other material. In some embodiments, an HV application is defined as power supplier, motor controller. In some embodiment, the select gate (e.g., switch SB, SS) maybe the same size as the bit cell. In some embodiments, the oxide of an HP and/or an HV device may identify as gate oxide. In some embodiments, an HP device will use thinner gate oxide and an HV device will use a thicker gate oxide. In some embodiments, an HP device may change the oxide to LK oxide, which may also improve the performance.

FIG. 8H is a table showing example embodiments of an HP application, an LP application, and an HV application. In one embodiment, an HP product may be an HPC or artificial intelligence (AI) computing device. In one embodiment, the size of the structure 806F (e.g., a SG WL) of the select gate (e.g., switch SB, SS) in the vertical dimension (e.g., z-dimension) is larger than the size of the structure 810F (e.g., Cell WL) of the bit cell in the vertical dimension. In one embodiment, an SG device may have a thinner gate oxide. In one embodiment, an SG device can adapt LK as isolation OX.

In one embodiment, an LP product may be one or more smart phone chips. In one embodiment, the size of the structure 806F (e.g., a SG WL) of the select gate (e.g., switch SB, SS) in the vertical dimension (e.g., z-dimension) is smaller than the size of the structure 810F (e.g., Cell WL) of the bit cell in the vertical dimension.

In one embodiment, an HV product may be an HPC or artificial intelligence (AI) computing device. In one embodiment, an SG device may have thicker gate oxide.

Figure 8I:
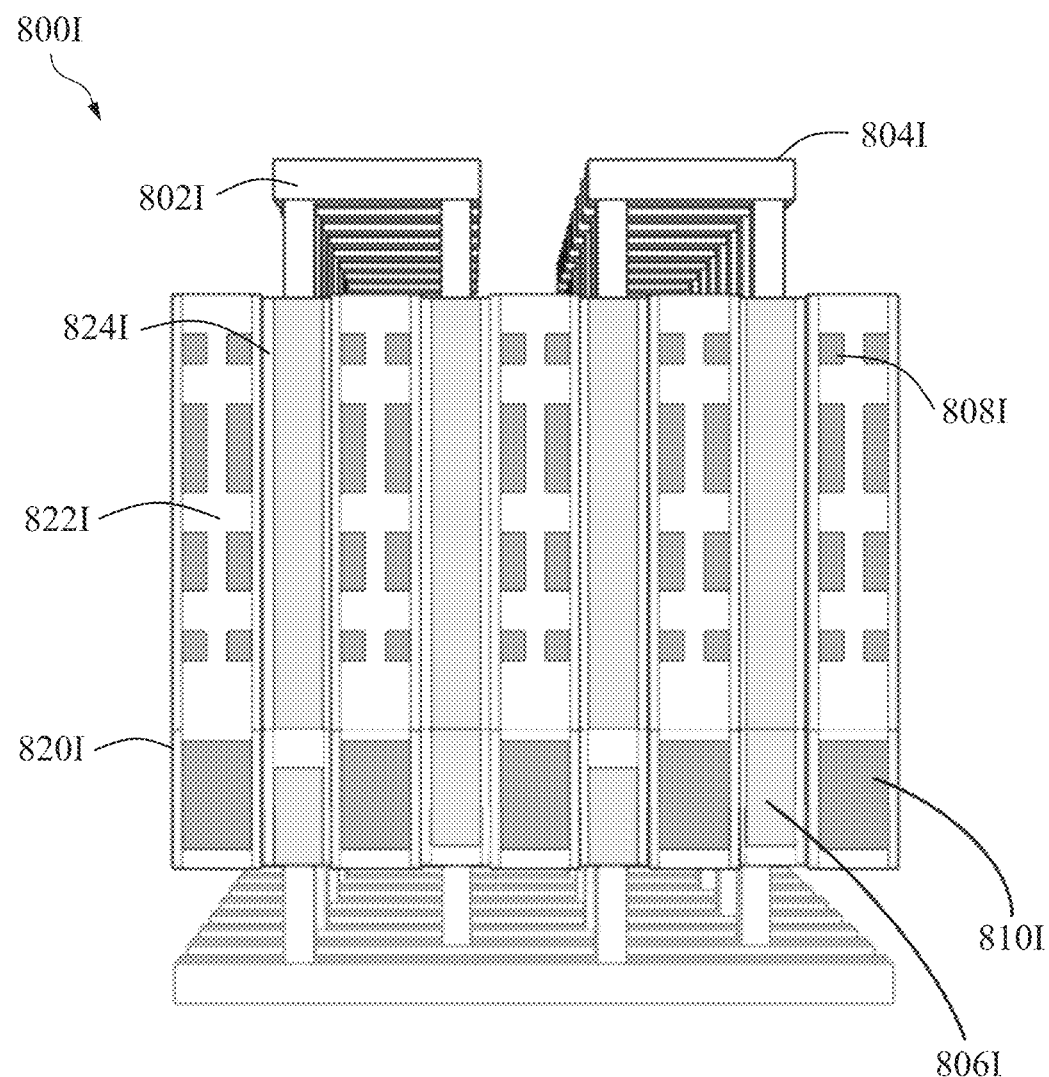
FIG. 8I is a diagram showing an example implementation of a memory array having GSL/GBL connections and single-side switches SS, SB positioned on the top-side of the memory array, in accordance with one embodiment.

FIG. 8I is a diagram showing an example implementation of a memory array having GSL/GBL connections and single-side switches SS, SB positioned on the top-side of the memory array, in accordance with one embodiment. The memory array 800I includes a structure 802I (e.g., S/BL connect) implemented for a global bit line GBL connection. The memory array 800I includes a structure 804I (e.g., S/BL connect) implemented for a global select line GSL connection. The memory array 800I may include a structure 806I implemented for a switch (SS, SB), such as a transistor channel. The memory array 800I may include a structure 808I implemented for a non-split word line. The memory array 800I may also include a structure 810I (e.g., WL) implemented for a bit cell, such as a transistor. In some embodiments, the word line WL (e.g., structure 810I) is split or not by word line WL thickness. In some embodiments, a different layer (e.g., a floor in the z-direction) of the memory array 800I may be a different effective word line WL (e.g., structure 810I). In some embodiments, large effective width may be for strong Ion bit cell. In some embodiments, small effective width may be for low Ion bit cell. In some embodiments, non-split WL (e.g., structure 810I) may be for a special bit cell or select gate SG (e.g., switches SS, SB) with strong Ion.

Figure 8J:
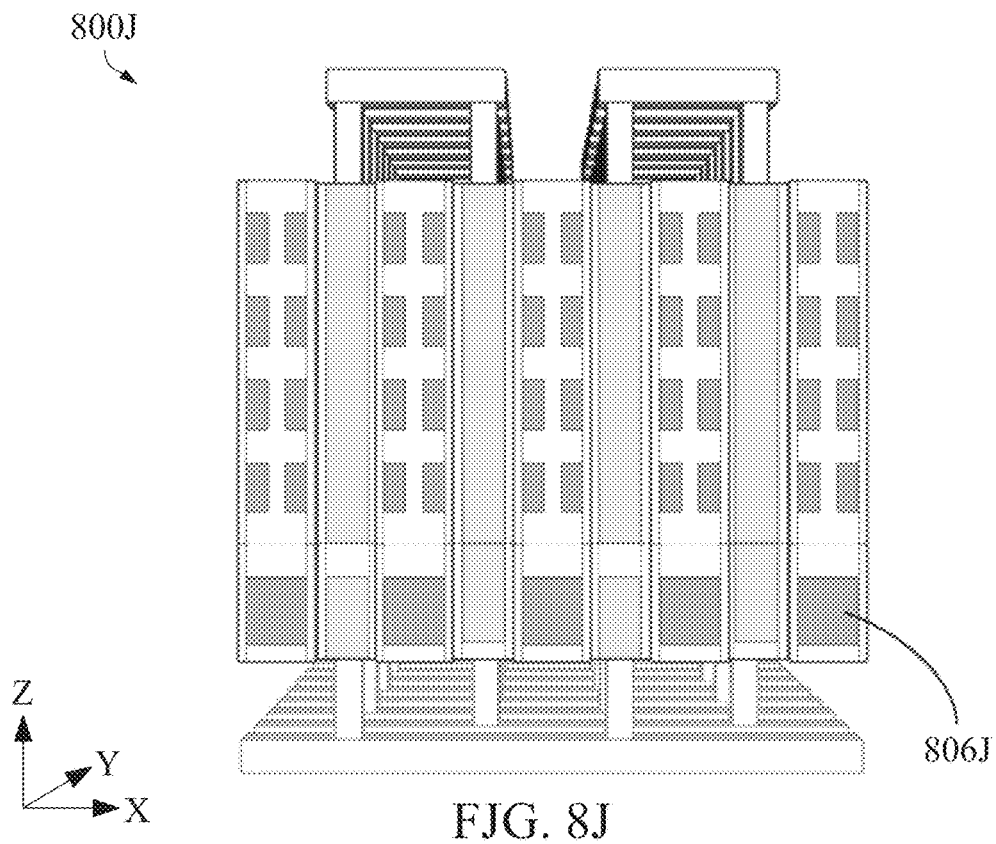
FIGS. 8J-8K are diagrams showing example implementations of memory arrays having GSL/GBL connections and merged select gates, in accordance with one embodiment.
Figure 8K:
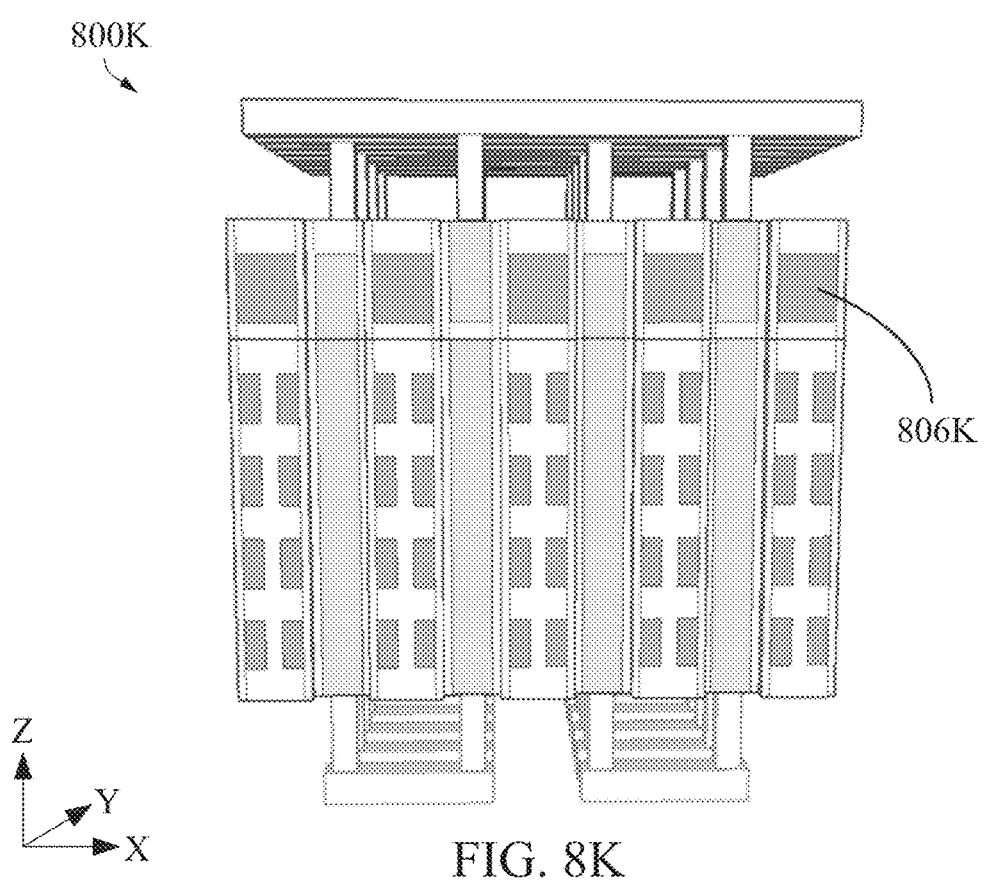

FIGS. 8J-8K are diagrams showing example implementations of memory arrays having GSL/GBL connections and merged select gates, in accordance with one embodiment. The memory array 800J includes a structure 806J implemented for a merged select gate (e.g., switches SS, SB) on the bottom-side of memory array 800J. The memory array 800K includes a structure 806K implemented for a merged select gate (e.g., switches SS, SB) on the top side of memory array 800K. A merged select SG may be configured for strong Ion cell to perform the bit cell selection.

Figure 8L:
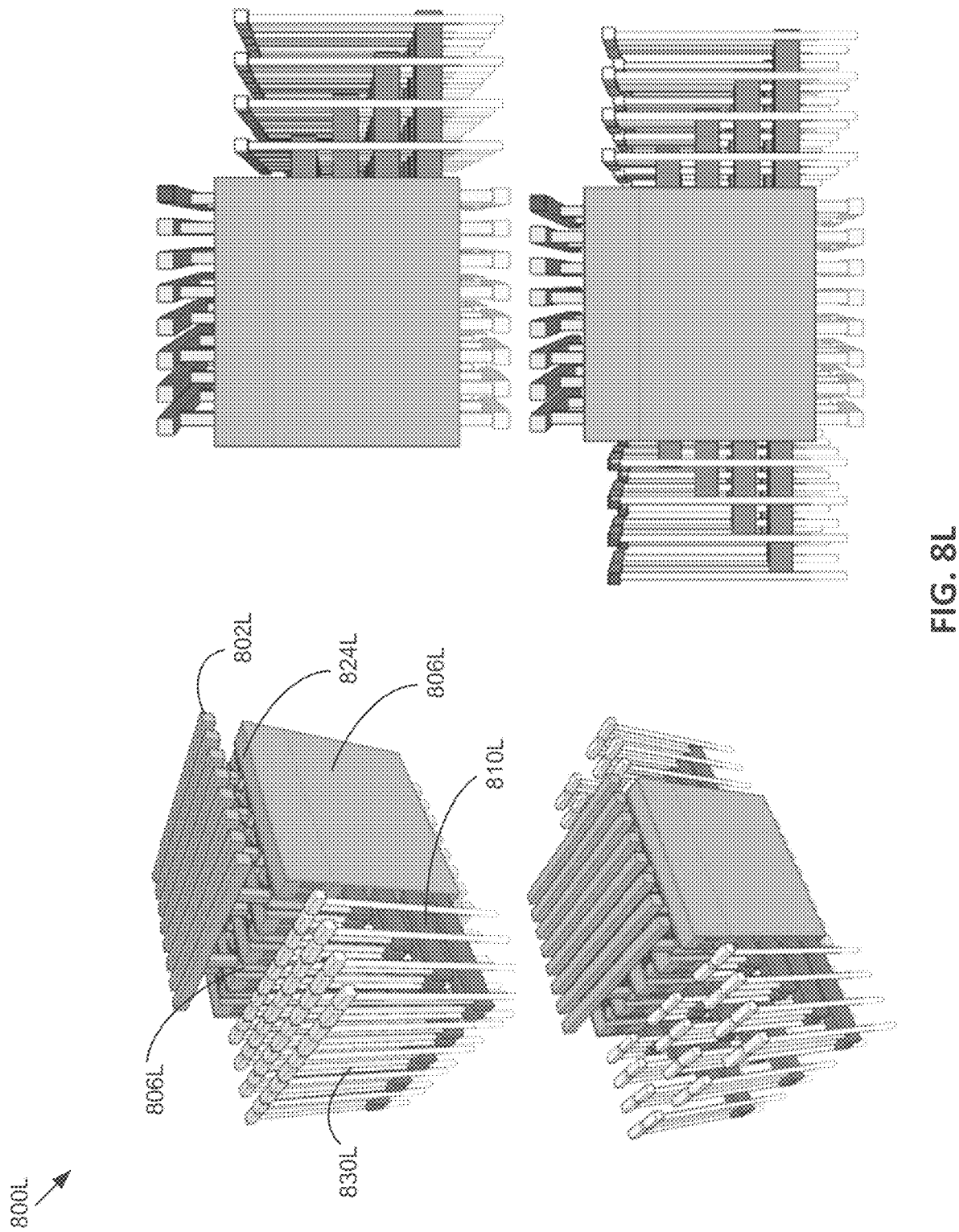
FIG. 8L is a diagram showing an example implementation of a memory array from four different perspectives, in accordance with one embodiment.

FIG. 8L is a diagram showing an example implementation of a memory array from four different perspectives, in accordance with one embodiment. As shown in FIG. 8L, a memory array 800L includes a structure 802L (e.g., S/BL connect) implemented for a global bit line GBL connection. The memory array 800L may also include a structure 806L (e.g., SL/BL) implemented for a switch (SS, SB), such as a transistor channel. The memory array 800L may also include a structure 810L (e.g., WL) implemented for a bit cell, such as a transistor. The memory array 800L may also include a structure 824L implemented for a channel. The memory array 800L may also include a structure 830L implemented for a via (sometimes referred to as a, "staircase via").

The memory array 800L may include a two-side word line WL (e.g., structure 810L) contact to relax (e.g., loosen) the routing pitch. The memory array 800L may include one or more structures and/or layers of a first type that include polysilicon, TiN, W, Cu or any conductive material. In one example, the memory array 800L may include one or more structures and/or layers of a second type that include polysilicon, LTPS, a-Si TFT, IGZO, or any semiconductor characteristic material. In one example, the memory array 800L may include one or more structures and/or layers of a third type that include Perovskite, SBT, PZT, HfZrO, HfO and any ferroelectric characteristic material. Between the structures and/or layers, the memory cell 800L may include a structure for isolation. For example, a structure may electrically isolate or decouple between other structures.

3. Method(s) for Implementing the Illustrative Embodiments

Figure 9:
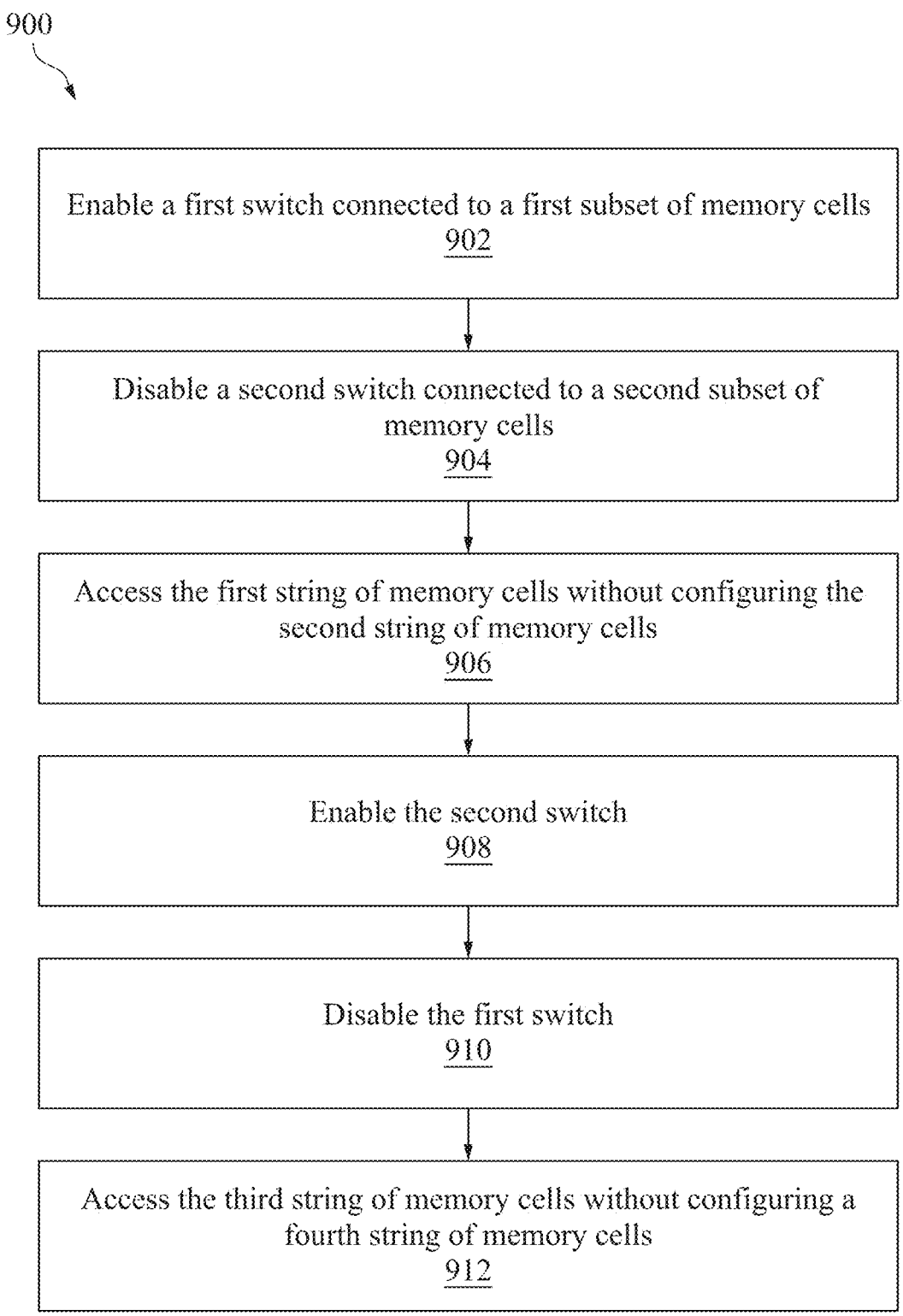
FIG. 9 is a flowchart showing a method of accessing and/or operating a memory cell and/or a memory array, in accordance with some embodiments.

FIG. 9 is a flowchart showing a method 900 of accessing and/or operating a memory cell (e.g., memory cell 125) and/or a memory array (e.g., memory array 210), in accordance with some embodiments. The method 900 may be performed by the memory controller 105 of FIG. 1. In some embodiments, the method 900 is performed by other entities. In some embodiments, the method 900 includes more, fewer, or different operations than shown in FIG. 9.

In an operation 902, the memory controller 105 enables (e.g., selects), during a first time period, a first switch (e.g., SB, SS) connected to a first subset (e.g., 310[00]) of a set (e.g., 310[00] . . . 310[03]) of memory cells, wherein the first subset includes a first string of memory cells and a second string of memory cells. By enabling the first switch, the first subset of memory cells (including its respective first and second string of memory cells) may be electrically coupled to one or more global lines. For example, switches SB, SS connected to the subset 310[00] of memory cells may be enabled, such that the subset 310[00] of memory cells can be electrically coupled to the global bit line GBL[0] and the global select line GSL[0] during the first time period.

In an operation 904, the memory controller 105 disables (e.g., deselects), during the first time period, a second switch (e.g., SB, SS) connected to a second subset (e.g., 310[01]) of the set (e.g., 310[00] . . . 310[03]) of memory cells, wherein the second subset includes a third string of memory cells and a fourth string of memory cells. By disabling the second switch, the second subset of memory cells (including its respective third and fourth string of memory cells) may be electrically decoupled from the one or more global lines. For example, switches SB, SS connected to the subset 310[01] of memory cells may be disabled, such that the subset 310[01] of memory cells can be electrically decoupled from the global bit line GBL[0] and the global select line GSL[0] during the first time period. In one approach, the memory controller 105 may disable switches (e.g., SB, SS) connected to other subsets (e.g., 310[02], 310[03]) of the set (e.g., 310[00] . . . 310[03]) of memory cells, such that the global line (e.g., GBL[0], GSL[0]) has a capacitive loading corresponding to the first subset (e.g., 310[00]) of memory cells instead of the entire set (e.g., 310[00] . . . 310[03]) of memory cells.

In an operation 906, the memory controller 105 accesses (e.g., configures, programs, reads, writes), during the first time period, one or more memory cells of the first subset (e.g., 310[00]) of memory cells. For example, the memory controller 105 may apply a voltage, current, or pulse to a string of memory cells through its respective split word line (e.g., WL[X][Y]_L or WL[X][Y]_R) to program the string of memory cells or cause the string of memory cells to conduct current according to the programmed data. For example, a first string of memory cells that are positioned on the left side of selected subset 310[00] may be coupled to WL[0][0]_L and a second string of memory cells that are positioned on the right side of selected subset 310[00] may be coupled to WL[0][0]_R. The memory controller 105 may access the first string of memory cells by applying a voltage, current, or pulse to WL[0][0]_L. Since the second string of memory cells are not coupled to WL[0][0]_L, but rather coupled to WL[0][0]_R, the memory controller 105 may access the first string of memory cells without being loaded by the capacitance of the second string of memory cells.

In one approach, the memory controller 105 may apply the voltage, current, or pulse to other strings of memory cells in unselected subsets (e.g., 310[01] . . . 310[03]) of memory cells. However, because the switches SB, SS connected to the unselected subsets of memory cells are electrically decoupled from the global lines GBL, GSL, the memory cells in the unselected subsets may not be programmed or may not conduct current despite the voltage, current, or pulses applied. Hence, the memory controller 105 may access a string of memory cells in a selected subset (e.g., 310[00]) of memory cells without being loaded by the capacitance of other strings of memory cells in unselected subsets.

In one approach, the memory controller 105 may enable, during the first time period, a third switch (e.g., SB, SS) connected to a third subset (e.g., 310[10]) of a set (e.g., 310[10] . . . 310[13]) of memory cells, wherein the third subset includes a fifth string of memory cells and a sixth string of memory cells. The memory controller 105 may disable, during the first time period, a fourth switch (e.g., SB, SS) connected to a fourth subset (e.g., 310[11]) of the set (e.g., 310[10] . . . [13]) of memory cells, wherein the fourth subset includes a seventh string of memory cells and a eighth string of memory cells. During the first time period, the memory controller 105 may disable other switches (e.g., SB, SS) connected other subsets (e.g., 310[12], 310[13]) of the set of memory cells. By enabling the third switch connected to the third subset (e.g., 310[10]) of memory cells (including its respective fifth and sixth string of memory cells) and disabling other switches connected to other subsets (e.g., 310[11] . . . 310[13]) of the set of memory cells (e.g., 310[10] . . . 310[13]), the global line (e.g., GBL[1], GSL[1]) may have a capacitive loading corresponding to the third subset (e.g., 310[10]) of memory cells instead of the entire set (e.g., 310[10] . . . 310[13]) of memory cells. Moreover, a string of memory cells of the third subset (e.g., 310[10]) of memory cells can be accessed via its respective split word line (e.g., WL[X][Y]_L), while a string of memory cells of the first subset (e.g., 310[00]) of memory cells can be accessed through the same (shared) word line during the first time period. For example, a fifth string of memory cells that are positioned on the left side of subset 310[10] and a first string of memory cells that are positioned on the left side of subset 310[00] can each be accessed via WL[0][0]_L. As another example, a sixth string of memory cells that are positioned on the right side of subset 310[10] and a second string of memory cells that are positioned on the right side of subset 310[00] can each be accessed via WL[0][0]_R.

In an operation 908, the memory controller 105 enables, during a second time period, the second switch (e.g., SB, SS) connected to the second subset (e.g., 310[01]) of the set (e.g., 310[00] . . . 310[03]) of memory cells. By enabling the second switch, the second subset (e.g., 310[01]) of memory cells (including its respective third and fourth string of memory cells) may be electrically coupled to the global line. For example, switches SB, SS connected to the subset 310[01] of memory cells may be enabled, such that the subset 310[01] of memory cells can be electrically coupled to the global bit line GBL[0] and the global select line GSL[0] during the second time period.

In an operation 910, the memory controller 105 disables, during the second time period, the first switch (e.g., SB, SS) connected to the first subset (e.g., 310[00]) of the set (e.g., 310[00] . . . 310[03]) of memory cells. By disabling the first switch, the first subset (e.g., 310[00]) of memory cells may be electrically decoupled from the global line. For example, switches SB, SS connected to the subset 310[00] of memory cells may be disabled, such that the subset 310[00] of memory cells (including its respective first and second string of memory cells) can be electrically decoupled from the global bit line GBL[0] and the global select line GSL[0]. In one approach, the memory controller 105 may disable switches (e.g., SB, SS) connected to other subsets (e.g., 310[02], 310[03]) of the set (e.g., 310[00] . . . 310[03]) of memory cells, such that the global line (e.g., GBL[0], GSL[0]) has a capacitive loading corresponding to the second subset (e.g., 310[01]) of memory cells instead of the entire set (e.g., 310[00] . . . 310[03]) of memory cells.

In an operation 912, the memory controller 105 accesses (e.g., configures, programs, reads, writes), during the second time period, one or more memory cells of the second subset (e.g., 310[01]) of memory cells. For example, the memory controller 105 may apply a voltage, current, or pulse to a string of memory cells through its respective split word line (e.g., WL[X][Y]_L or WL[X][Y]_R) to program the string of memory cells or cause the string of memory cells to conduct current according to the programmed data.

In one approach, the memory controller 105 may apply the voltage, current, or pulse to other strings of memory cells in unselected subsets (e.g., 310[00], 310[02] . . . 310[03]) of memory cells. However, because the switches SB, SS connected to the unselected subsets of memory cells are electrically decoupled from the global lines GBL, GSL, the memory cells in the unselected subsets may not be programmed or may not conduct current despite the voltage, current, or pulses applied through word lines. Hence, the memory controller 105 may access a string of memory cells in a selected subset (e.g., 310[01]) of memory cells without being loaded by the capacitance of other strings of memory cells in unselected subsets.

In one approach, the memory controller 105 may enable, during the second time period, the fourth switch (e.g., SB, SS) connected to the fourth subset (e.g., 310[11]) of the set (e.g., 310[10] . . . 310[13]) of memory cells, wherein the third subset includes a fifth string of memory cells and a sixth string of memory cells. The memory controller 105 may disable, during the second time period, the third switch (e.g., SB, SS) connected to the third subset (e.g., 310[10]) of the set (e.g., 310[10] . . . [13]) of memory cells, wherein the third subset includes a third string of memory cells and a fourth string of memory cells. During the second time period, the memory controller 105 may disable other switches (e.g., SB, SS) connected other subsets (e.g., 310[12], 310[13]) of the set of memory cells. By enabling the fourth switch connected to the fourth subset (e.g., 310[11]) of memory cells (including its respective seventh and eighth string of memory cells) and disabling other switches connected to other subsets (e.g., 310[10], 310[12] . . . 310[13]) of the set of memory cells (e.g., 310[10] . . . 310[13]), the global line (e.g., GBL[1], GSL[1]) may have a capacitive loading corresponding to the fourth subset (e.g., 310[11]) of memory cells instead of the entire set (e.g., 310[10] . . . 310[13]) of memory cells. Moreover, a string of memory cells of the fourth subset (e.g., 310[11]) of memory cells can be accessed, while a string of memory cells of the second subset (e.g., 310[01]) of memory cells are accessed through the same (e.g., shared, common, coupled) word line during the second time period.

4. Computing System for Implementing the Illustrative Embodiments

Figure 10:
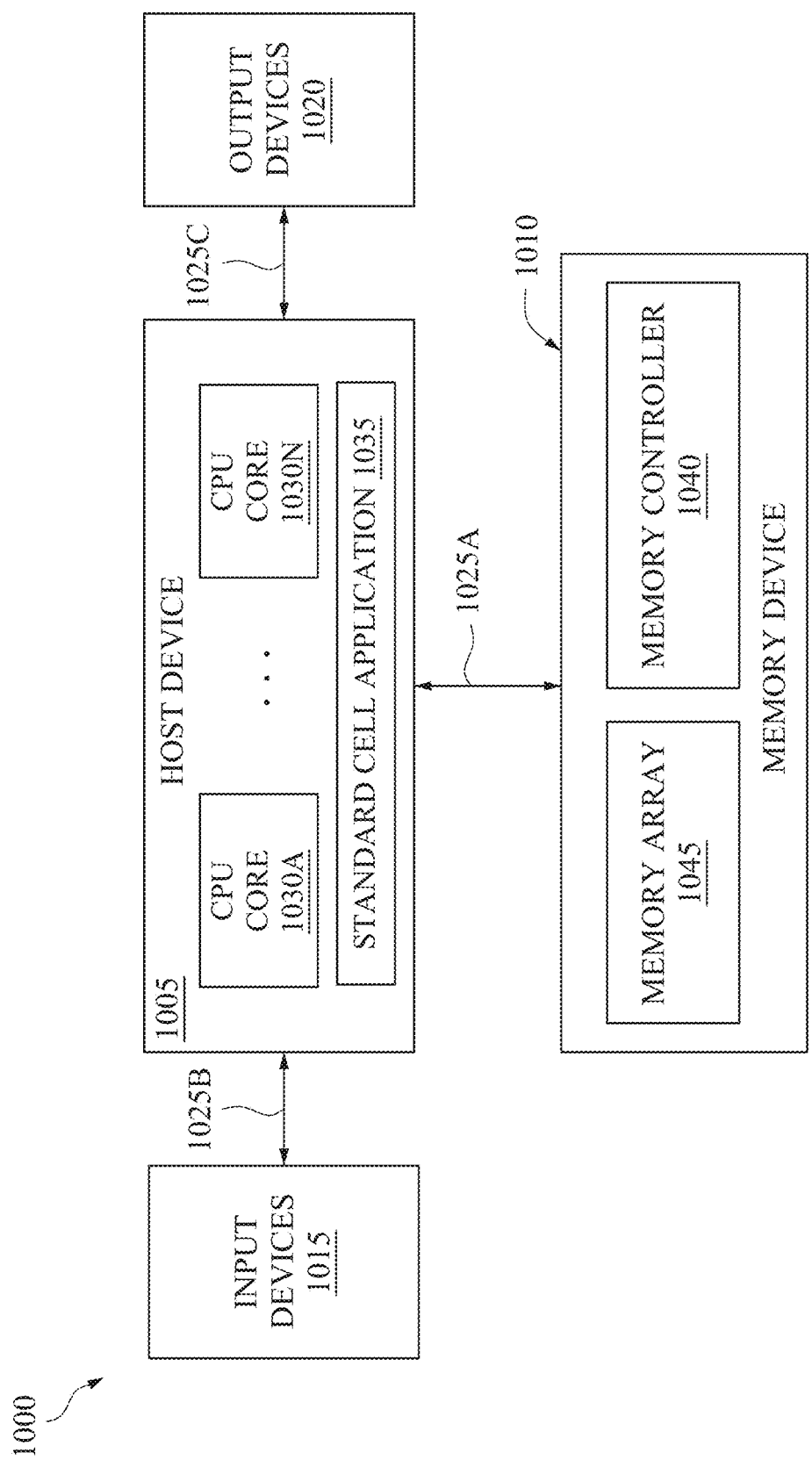
FIG. 10 is an example block diagram of a computing system 1000, in accordance with some embodiments of the disclosure.

FIG. 10 is an example block diagram of a computing system 1000, in accordance with some embodiments of the disclosure. The computing system 1000 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1000 includes a host device 1005 associated with a memory device 1010. The host device 1005 may be configured to receive input from one or more input devices 1015 and provide output to one or more output devices 1020. The host device 1005 may be configured to communicate with the memory device 1010, the input devices 1015, and the output devices 1020 via appropriate interfaces 1025A, 1025B, and 1025C, respectively. The computing system 1000 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1005.

The input devices 1015 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1020 may include a variety of output technologies such as external memories, printers, speakers, displays, microphones, light emitting diodes, headphones, video devices, and any other output peripherals that are configured to receive information (e.g., data) from the host device 1005. The "data" that is either input into the host device 1005 and/or output from the host device may include any of a variety of textual data, circuit data, signal data, semiconductor device data, graphical data, combinations thereof, or other types of analog and/or digital data that is suitable for processing using the computing system 1000.

The host device 1005 includes or is associated with one or more processing units/processors, such as Central Processing Unit ("CPU") cores 1030A-1030N. The CPU cores 1030A-1030N may be implemented as an Application Specific Integrated Circuit ("ASIC"), Field Programmable Gate Array ("FPGA"), or any other type of processing unit. Each of the CPU cores 1030A-1030N may be configured to execute instructions for running one or more applications of the host device 1005. In some embodiments, the instructions and data to run the one or more applications may be stored within the memory device 1010. The host device 1005 may also be configured to store the results of running the one or more applications within the memory device 1010. Thus, the host device 1005 may be configured to request the memory device 1010 to perform a variety of operations. For example, the host device 1005 may request the memory device 1010 to read data, write data, update or delete data, and/or perform management or other operations. One such application that the host device 1005 may be configured to run may be a standard cell application 1035. The standard cell application 1035 may be part of a computer aided design or electronic design automation software suite that may be used by a user of the host device 1005 to use, create, or modify a standard cell of a circuit. In some embodiments, the instructions to execute or run the standard cell application 1035 may be stored within the memory device 1010. The standard cell application 1035 may be executed by one or more of the CPU cores 1030A-1030N using the instructions associated with the standard cell application from the memory device 1010. In one example, the standard cell application 1035 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 10, the memory device 1010 includes a memory controller 1040 that is configured to read data from or write data to a memory array 1045. The memory array 1045 may include a variety of volatile and/or non-volatile memories. For example, in some embodiments, the memory array 1045 may include NAND flash memory cores. In other embodiments, the memory array 1045 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1045 may be individually and independently controlled by the memory controller 1040. In other words, the memory controller 1040 may be configured to communicate with each memory within the memory array 1045 individually and independently. By communicating with the memory array 1045, the memory controller 1040 may be configured to read data from or write data to the memory array in response to instructions received from the host device 1005. Although shown as being part of the memory device 1010, in some embodiments, the memory controller 1040 may be part of the host device 1005 or part of another component of the computing system 1000 and associated with the memory device. The memory controller 1040 may be implemented as a logic circuit in either software, hardware, firmware, or combination thereof to perform the functions described herein. For example, in some embodiments, the memory controller 1040 may be configured to retrieve the instructions associated with the standard cell application 1035 stored in the memory array 1045 of the memory device 1010 upon receiving a request from the host device 1005.

It is to be understood that only some components of the computing system 1000 are shown and described in FIG. 10. However, the computing system 1000 may include other components such as various batteries and power sources, networking interfaces, routers, switches, external memory systems, controllers, etc. Generally speaking, the computing system 1000 may include any of a variety of hardware, software, and/or firmware components that are needed or considered desirable in performing the functions described herein. Similarly, the host device 1005, the input devices 1015, the output devices 1020, and the memory device 1010 including the memory controller 1040 and the memory array 1045 may include other hardware, software, and/or firmware components that are considered necessary or desirable in performing the functions described herein.

One aspect of this description relates to a memory array. In some embodiments, the memory array includes a first set of memory cells including a first subset of memory cells and a second subset of memory cells. In some embodiments, the memory array includes a first switch including a first electrode connected to first electrodes of the first subset of memory cells, and a second electrode connected to a first global line. In some embodiments, the memory array includes a second switch including a first electrode connected to first electrodes of the second subset of memory cells, and a second electrode connected to the first global line.

One aspect of this description relates to a memory system. In some embodiments, the memory system includes a memory array and a controller. In some embodiments, the memory array includes a first set of memory cells, a second set of memory cells, a first switch connected to the first set of memory cells, and a second switch connected to the second set of memory cells. In some embodiments, the controller is connected to the memory array. In some embodiments, the controller is to enable, during a first time period, the first switch while disabling the second switch to electrically couple the first set of memory cells to a first global select line and electrically decouple the second set of memory cells from the first global select line. In some embodiments, the controller is to enable, during a second time period, the second switch while disabling the first switch to electrically couple the second set of memory cells to the first global select line and electrically decouple the first set of memory cells from the first global select line.

One aspect of this description relates to a method of operating a memory system. In some embodiments, the method includes enabling, during a first time period, a first switch connected to first electrodes of a first set of memory cells to electrically couple the first electrodes of the first set of memory cells to a first global select line. In some embodiments, the method includes disabling, during the first time period, a second switch connected to first electrodes of a second set of memory cells to electrically decouple the first electrodes of the second set of memory cells from the first global select line. In some embodiments, the method includes enabling, during the first time period, a third switch connected to second electrodes of the first set of memory cells to electrically couple the second electrodes of the first set of memory cells to a first global bit line. In some embodiments, the method includes disabling, during the first time period, a fourth switch connected to second electrodes of the second set of memory cells to electrically decouple the second electrodes of the second set of memory cells from the first global bit line. In some embodiments, the method includes configuring, during the first time period, one or more memory cells of the first set of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
a first set of memory cells including:
a first string of memory cells and a second string of memory cells that each extend across a plurality of layers of the memory array, each layer including a memory cell of the first string of memory cells having a gate electrode that is coupled to a first word line associated with the layer and a memory cell of the second string of memory cells having a gate electrode that is coupled to a second word line associated with the layer;
a first switch including:
a first electrode connected to first electrodes of the first string of memory cells and first electrodes of the second string of memory cells, and
a second electrode connected to a first global bit line; and
a second switch including:
a first electrode connected to second electrodes of the first string of memory cells and second electrodes of the second string of memory cells, and
a second electrode connected to a first global select line,
wherein a gate electrode of the first switch and a gate electrode of the second switch are connected to a same switch control line.

2. The memory array of claim 1, further comprising:
a second set of memory cells including a third string of memory cells and a fourth string of memory cells;
a third switch including:
a first electrode connected to first electrodes of the third string of memory cells and first electrodes of the fourth string of memory cells, and
a second electrode connected to a second global bit line,
wherein gate electrodes of the third string of memory cells are connected to the first word line and gate electrodes of the fourth string of memory cells are connected to the second word line.

3. The memory array of claim 2, further comprising:
a fourth switch including:
a first electrode connected to second electrodes of the third string of memory cells and second electrodes of the fourth string of memory cells, and
a second electrode connected to a second global select line.

4. The memory array of claim 3,
wherein a gate electrode of the third switch and a gate electrode of the fourth switch are connected to a same second switch control line.

5. The memory array of claim 1, further comprising:
a second set of memory cells including a third string of memory cells and a fourth string of memory cells; and
a third switch including:
a first electrode connected to first electrodes of the third string of memory cells and first electrodes of the fourth string of memory cells, and
a second electrode connected to the first global bit line,
wherein gate electrodes of the third string of memory cells are connected to a third word line and gate electrodes of the fourth string of memory cells are connected to a fourth word line.

6. The memory array of claim 5, further comprising:
a fourth switch including:
a first electrode connected to second electrodes of the third string of memory cells and second electrodes of the fourth string of memory cells, and
a second electrode connected to the second global select line.

7. The memory array of claim 6,
wherein a gate electrode of the third switch and a gate electrode of the fourth switch are connected to a same second switch control line.

8. The memory array of claim 1, wherein the first set of memory cells and the first switch correspond to matching types of transistors, wherein the types of transistors include N-type metal-oxide-semiconductor field effect transistors (NMOS) or P-type metal-oxide-semiconductor field effect transistors (PMOS).

9. A memory system comprising:
a memory array including:
a first set of memory cells including a first string of memory cells having gate electrodes coupled to a first word line and a second string of memory cells having gate electrodes coupled to a second word line;
a first switch; and
a second switch, wherein a gate electrode of the first switch and a gate electrode of the second switch are connected to a same switch control line; and
a controller connected to the memory array, the controller is to:
toggle the first switch to electrically couple a first global bit line to first electrodes of the first string of memory cells and first electrodes of the second string of memory cells;
configure, responsive to toggling the first switch, the first string of memory cells using the first word line;
toggle the second switch to electrically couple a first global select line to second electrodes of the first string of memory cells and second electrodes of the second string of memory cells, and
configure, responsive to toggling the first switch and the second switch, the first string of memory cells using the first word line.

10. The memory system of claim 9, wherein the memory array further comprises:
a second set of memory cells including a third string of memory cells having gate electrodes coupled to the first word line and a fourth string of memory cells having gate electrodes coupled to the second word line; and
a third switch, wherein the controller is further to:
toggle, responsive to toggling the first switch and the second switches, the third switch to couple a second global bit line to first electrodes of the third string of memory cells and first electrodes of the fourth string of memory cells; and
a fourth switch; wherein the controller is further to:
toggle, responsive to toggling the first and second switch, the fourth switch to couple a second global select line to second electrodes of the third string of memory cells and second electrodes of the fourth string of memory cells.

11. The memory system of claim 9, wherein the controller is further to:
configure, responsive to toggling the first switch and the second switch, the second string of memory cells using the second word line.

12. The memory system of claim 9, wherein the memory array further comprises:
a second set of memory cells including a third string of memory cells having gate electrodes coupled to a third word line and a fourth string of memory cells having gate electrodes coupled to a fourth word line; and
a third switch, wherein the controller is further to:
toggle, prior to toggling the first switch and the second switch, the third switch to decouple the first global bit line from first electrodes of the third string of memory cells and first electrodes of the fourth string of memory cells.

13. The memory system of claim 12, wherein the memory array further comprises:
a fourth switch, wherein the controller is further to:
toggle, prior to toggling the first switch and the second switch, the third switch to decouple the first global select line from second electrodes of the third string of memory cells and second electrodes of the fourth string of memory cells.

14. The memory system of claim 9, wherein the first set of memory cells and the first switch correspond to matching types of transistors, wherein the types of transistors include N-type metal-oxide-semiconductor field effect transistors (NMOS) or P-type metal-oxide-semiconductor field effect transistors (PMOS).

15. A method comprising:
coupling, during a first time period, by enabling a first switch, first electrodes of a first string of memory cells of a set of memory cells and first electrodes of a second string of memory cells of the set of memory cells to a first global bit line;
coupling, during the first time period, by enabling a second switch, second electrodes of the first string of memory cells of the set of memory cells and second electrodes of the second string of memory cells of the set of memory cells to a first global select line, wherein a gate electrode of the first switch and a gate electrode of the second switch are connected to a same switch control line;
accessing, during the first time period, a gate electrode of the first string of memory cells of the set of memory cells without accessing a gate electrode of the second string of memory cells of the set of memory cells.

16. The method of claim 15, further comprising:
accessing, during a second time period, the gate electrode of the second string of memory cells of the set of memory cells without accessing the gate electrode of the first string of memory cells of the set of memory cells.

17. The memory system of claim 10, wherein a gate electrode of the third switch and a gate electrode of the fourth switch are connected to a same second switch control line.

18. The memory system of claim 13, wherein a gate electrode of the third switch and a gate electrode of the fourth switch are connected to a same second switch control line.

19. The method of claim 15, further comprising:
decoupling, during the first time period, by disabling a third switch, first electrodes of a second set of memory cells from the first global select line; and
decoupling, during the first time period, by disabling a fourth switch, second electrodes of the second set of memory cells from the first global bit line.

20. The method of claim 19, wherein a gate electrode of the third switch and a gate electrode of the fourth switch are connected to a same second switch control line.

* * * * *